(12) United States Patent
Malhotra et al.

(10) Patent No.: US 7,707,537 B2
(45) Date of Patent: Apr. 27, 2010

(54) METHOD AND APPARATUS FOR GENERATING LAYOUT REGIONS WITH LOCAL PREFERRED DIRECTIONS

(75) Inventors: Anish Malhotra, San Jose, CA (US); Jonathan Frankle, Los Gatos, CA (US); Asmus Hetzel, Berlin (DE)

(73) Assignee: Cadence Design Systems, Inc., San Jose, CA (US)

(*) Notice: Subject to any disclaimer, the term of this patent is extended or adjusted under 35 U.S.C. 154(b) by 658 days.

(21) Appl. No.: 11/005,162

(22) Filed: Dec. 6, 2004

(65) Prior Publication Data

US 2005/0273746 A1 Dec. 8, 2005

Related U.S. Application Data

(60) Provisional application No. 60/577,434, filed on Jun. 4, 2004.

(51) Int. Cl.
*G06F 17/50* (2006.01)
(52) U.S. Cl. ........................................ 716/13
(58) Field of Classification Search ................. 716/1–18
See application file for complete search history.

(56) References Cited

U.S. PATENT DOCUMENTS

| | | | |
|---|---|---|---|
| 4,571,451 A | 2/1986 | Linsker et al. | |
| 4,615,011 A | 9/1986 | Linsker | |
| 4,777,606 A | 10/1988 | Fournier | |
| 4,855,253 A | 8/1989 | Weber | |
| 4,855,929 A | 8/1989 | Nakajima | |
| 4,910,680 A | 3/1990 | Hiwatshi | |
| 5,375,069 A | 12/1994 | Satoh et al. | |
| 5,541,005 A * | 7/1996 | Bezama et al. | 428/551 |
| 5,635,736 A | 6/1997 | Funaki et al. | |
| 5,650,653 A | 7/1997 | Rostoker et al. | |
| 5,673,201 A | 9/1997 | Malm et al. | |

(Continued)

FOREIGN PATENT DOCUMENTS

JP 04000677 1/1992

(Continued)

OTHER PUBLICATIONS

Ousterhout, "Corner Stitching: A Data-Structuring Technique for VLSI Layout Tools", IEEE Transactions on Computer-Aided Design, vol. CAD-3, No. 1, Jan. 1984.*

(Continued)

*Primary Examiner*—Vuthe Siek
*Assistant Examiner*—Aric Lin
(74) *Attorney, Agent, or Firm*—Adeli & Tollen LLP

(57) ABSTRACT

Some embodiments of the invention provide a method for defining wiring directions in a design layout having several wiring layers. The method decomposes a first wiring layer into several non-overlapping regions. It assigns at least two different local preferred wiring directions to at least two of the regions. In some embodiment, the method decomposing the first wiring layer by using the vertices of items in the layout to decompose the layout. In some of these embodiments, the item include macro blocks. The method of some embodiments also identifies several power via arrays on the first wiring layer, and identifies a local preferred wiring direction based on the arrangement of the power via arrays on the first wiring layer.

32 Claims, 22 Drawing Sheets

U.S. PATENT DOCUMENTS

| | | | |
|---|---|---|---|
| 5,723,908 A | 3/1998 | Fuchida et al. | |
| 5,798,936 A | 8/1998 | Cheng | |
| 5,801,385 A | 9/1998 | Endo et al. | |
| 5,801,960 A | 9/1998 | Takano et al. | |
| 5,811,863 A | 9/1998 | Rostoker et al. | |
| 5,814,847 A | 9/1998 | Shihadeh et al. | |
| 5,880,969 A * | 3/1999 | Hama et al. | 716/12 |
| 5,980,093 A | 11/1999 | Jones et al. | |
| 6,006,024 A | 12/1999 | Guruswamy et al. | |
| 6,014,507 A | 1/2000 | Fujii | |
| 6,077,309 A * | 6/2000 | Lin | 716/14 |
| 6,209,123 B1 | 3/2001 | Maziasz et al. | |
| 6,256,769 B1 | 7/2001 | Tamarkin et al. | |
| 6,262,487 B1 | 7/2001 | Igarashi et al. | |
| 6,263,475 B1 | 7/2001 | Toyonaga et al. | |
| 6,324,674 B2 | 11/2001 | Andreev et al. | |
| 6,330,707 B1 | 12/2001 | Shinomiya et al. | |
| 6,407,434 B1 | 6/2002 | Rostoker et al. | |
| 6,441,470 B1 | 8/2002 | Shenoy | |
| 6,448,591 B1 | 9/2002 | Juengling | |
| 6,526,555 B1 | 2/2003 | Teig et al. | |
| 6,601,222 B1 | 7/2003 | Mehrotra et al. | |
| 6,671,864 B2 | 12/2003 | Teig et al. | |
| 6,711,727 B1 | 3/2004 | Teig et al. | |
| 6,769,105 B1 | 7/2004 | Teig et al. | |
| 6,772,406 B1 | 8/2004 | Trimberger | |
| 6,792,587 B2 | 9/2004 | Xing et al. | |
| 6,858,928 B1 * | 2/2005 | Teig et al. | 257/700 |
| 6,870,255 B1 | 3/2005 | Teig et al. | |
| 6,889,371 B1 | 5/2005 | Teig et al. | |
| 6,889,372 B1 | 5/2005 | Teig et al. | |
| 6,898,773 B1 | 5/2005 | Teig et al. | |
| 6,915,500 B1 | 7/2005 | Teig et al. | |
| 6,973,634 B1 * | 12/2005 | Teig et al. | 716/13 |
| 6,988,258 B2 | 1/2006 | Tan et al. | |
| 6,996,789 B2 | 2/2006 | Teig et al. | |
| 7,003,748 B1 * | 2/2006 | Hsu | 716/8 |
| 7,003,752 B2 | 2/2006 | Teig et al. | |
| 7,010,771 B2 | 3/2006 | Teig et al. | |
| 7,013,445 B1 * | 3/2006 | Teig et al. | 716/9 |
| 7,024,650 B2 | 4/2006 | Teig et al. | |
| 7,036,101 B2 | 4/2006 | He et al. | |
| 7,036,105 B1 | 4/2006 | Teig et al. | |
| 7,047,513 B2 | 5/2006 | Teig et al. | |
| 7,062,743 B2 | 6/2006 | Kahng et al. | |
| 7,080,342 B2 * | 7/2006 | Teig et al. | 716/14 |
| 7,086,024 B2 * | 8/2006 | Hsu et al. | 716/8 |
| 7,096,449 B1 | 8/2006 | Teig et al. | |
| 7,117,468 B1 | 10/2006 | Teig et al. | |
| 7,171,635 B2 | 1/2007 | Teig et al. | |
| 7,174,529 B1 | 2/2007 | Hetzel | |
| 7,185,304 B2 * | 2/2007 | Suto et al. | 716/9 |
| 7,197,738 B1 | 3/2007 | Hetzel et al. | |
| 7,340,711 B2 | 3/2008 | Hetzel et al. | |
| 7,412,682 B2 | 8/2008 | Malhotra et al. | |
| 2001/0039643 A1 * | 11/2001 | Kuroda et al. | 716/11 |
| 2002/0124231 A1 * | 9/2002 | Teig et al. | 716/7 |
| 2002/0147958 A1 | 10/2002 | Teig et al. | |
| 2003/0009737 A1 * | 1/2003 | Xing | 716/12 |
| 2003/0084416 A1 * | 5/2003 | Dai et al. | 716/7 |
| 2003/0088844 A1 | 5/2003 | Teig et al. | |
| 2004/0098696 A1 | 5/2004 | Teig et al. | |
| 2004/0098697 A1 | 5/2004 | Frankle et al. | |
| 2004/0243960 A1 * | 12/2004 | Hsu et al. | 716/8 |
| 2005/0229134 A1 | 10/2005 | Hetzel et al. | |
| 2005/0240894 A1 | 10/2005 | Teig | |
| 2005/0273747 A1 | 12/2005 | Malhotra et al. | |
| 2005/0273748 A1 | 12/2005 | Hetzel et al. | |
| 2006/0156266 A1 | 7/2006 | Alpert et al. | |
| 2006/0236291 A1 | 10/2006 | Siegel et al. | |

FOREIGN PATENT DOCUMENTS

| | | |
|---|---|---|
| WO | WO 2005/122027 | 12/2005 |
| WO | WO 2005/122028 | 12/2005 |

OTHER PUBLICATIONS

Cheng-Kok Koh and Patrick H. Madden, Manhattan or Non Manhattan? A Study of Alternative VLSI routing Architectures, 2000, pp. 47-52.

U.S. Appl. No. 11/005,316, filed Dec. 6, 2004, Asmus Hetzel, et al.

U.S. Appl. No. 11/005,169, filed Dec. 6, 2004, Anish Malhotra, et al.

U.S. Appl. No. 11/005,448, filed Dec. 6, 2004, Asmus Hetzel, et al.

International Search Report, Cadence Design Systems, Inc., Feb. 15, 2006, International Search Report of PCT Application based on U.S. Appl. No. 11/005,448, which is related to this application.

Written Opinion of the International Searching Authority, Cadence Design Systems, Inc., Feb. 15, 2006, Written Opinion of the International Searching Authority of PCT Application based on U.S. Appl. No. 11/005,448, which is related to this application.

U.S. Appl. No. 11/005,316 (Non-Final Office Action), filed Dec. 6, 2004, Hetzel, Non-Final Office Action mailed Apr. 26, 2007 of related application.

U.S. Appl. No. 09/733,104, filed Dec. 7, 2000, Teig, Related Application.

U.S. Appl. No. 11/031,472, filed Jan. 6, 2005, Teig, Related Application.

U.S. Appl. No. 09/733,104 (Non-Final Office Action), filed Dec. 7, 2000, Non-Final Office Action mailed Oct. 27, 2003 of related application.

U.S. Appl. No. 09/733,104 (Final Office Action), filed Dec. 7, 2000, Teig, Final Office Action mailed Sep. 26, 2002 of related application.

U.S. Appl. No. 09/733,104 (Non-Final Office Action), filed Dec. 7, 2000, Teig, Non-Final Office Action mailed Jan. 3, 2002 of related application.

U.S. Appl. No. 11/005,169 (Non-Final Office Action), filed Dec. 6, 2004, Malhotra, Non-Final Office Action mailed Jan. 18, 2007 of related application.

U.S. Appl. No. 11/005,448 (Non-Final Office Action), filed Dec. 6, 2004, Hetzel, Non-Final Office Action mailed Aug. 25, 2005 of related application.

U.S. Appl. No. 11/005,448 (Non-Final Office Action), filed Dec. 6, 2004, Hetzel, Non-Final Office Action mailed Mar. 14, 2007 of related application.

U.S. Appl. No. 11/031,472 (Non-Final Office Action), filed Jan. 6, 2005, Teig, Non-Final Office Action mailed Sep. 20, 2006 of related application.

International Search Report, Sep. 2006, Cadence Design Systems, Inc., International Search Report of PCT Application PCT/US2005/019361 based on U.S. Appl. No. 11/005,316, which is related to this application.

Written Opinion of the International Searching Authority, Sep. 2006, Cadence Design Systems, Inc., Written Opinion of the International Searching Authority of PCT Application PCT/US2005/019361 based on U.S. Appl. No. 11/005,316, which is related to this application.

U.S. Appl. No. 11/457,272, filed Jul. 13. 2006, Wadland, et al.

Notice of Allowance of U.S. Appl. No. 09/733,104, Nov. 16, 2004 (mailing date), Teig, et al., Notice of Allowance of commonly owned U.S. Patent Application, which issued as U.S. Patent 6,858,928.

Advisory Action of U.S. Appl. No. 09/733,104, Apr. 17, 2003 (mailing date), Teig, et al., Advisory Action of a commonly owned U.S. Patent Application, which issued as U.S. Patent 6,858,928.

Notice of Allowance of U.S. Appl. No. 11/005,316, Jun. 5, 2008 (mailing date), Hetzel, et al., Notice of Allowance of a commonly owned pending U.S. Patent Application.

Non-Final Office Action of U.S. Appl. No. 11/005,316, Oct. 2, 2007 (mailing date), Hetzel, et al., Non-Final Office Action of a commonly owned pending U.S. Patent Application.

Restriction Requirement of U.S. Appl. No. 11/005,316, Feb. 12, 2007 (mailing date), Hetzel, et al., Restriction Requirement of a commonly owned pending U.S. Patent Application.

Response to Rule 312 Communication of U.S. Appl. No. 11/005,169, May 1, 2008 (mailing date), Malhotra, et al., Response to Rule 312 Communication of a commonly owned U.S. Patent Application, which issued as U.S. Patent 7,412,682.

Supplemental Notice of Allowance of U.S. Appl. No. 11/005,169, Apr. 10, 2008 (mailing date), Malhotra, et al., Supplemental Notice of Allowance of a commonly owned U.S. Patent Application, which issued as U.S. Patent 7,412,682.

Amendment after Notice of Allowance of U.S. Appl. No. 11/005,169, Apr. 2, 2008 (mailing date), Malhotra, et al., Amendment after Notice of Allowance of a commonly owned U.S. Patent Application, which issued as U.S. Patent 7,412,682.

Notice of Allowance of U.S. Appl. No. 11/005,169, Jan. 2, 2008 (mailing date), Malhotra, et al., Notice of Allowance of a commonly owned U.S. Patent Application, which issued as U.S. Patent 7,412,682.

Final Office Action of U.S. Appl. No. 11/005,169, Aug. 9. 2007 (mailing date), Malhotra, et al., Final Office Action of a commonly owned U.S. Patent Application, which issued as U.S. Patent 7,412,682.

Amendment after Notice of Allowance of U.S. Appl. No. 11/005,448, Dec. 7, 2007 (mailing date), Hetzel, et al., Amendment after Notice of Allowance of a commonly owned U.S. Patent Application, which issued as U.S. Patent 7,340,711.

Supplemental Notice of Allowance of U.S. Appl.No. 11/005,448, Oct. 18, 2007 (mailing date), Hetzel, et al., Supplemental Notice of Allowance of a commonly owned U.S. Patent Application, which issued as U.S. Patent 7,340,711.

Notice of Allowance of U.S. Appl. No. 11/005,448, Sep. 7, 2007 (mailing date), Hetzl, et al., Notice of Allowance of a commonly owned U.S. Patent Application, which issued as U.S. Patent 7,340,711.

Restriction Requirement of U.S. Appl. No. 11/005,448, May 5, 2006 (mailing date), Hetzel, et al., Restriction Requirement of a commonly owned U.S. Patent Application, which issued as U.S. Patent 7,340,711.

Restriction Requirement of U.S. Appl. No. 11/005,448, Nov. 23, 2005 (mailing date), Hetzel, et al., Restriction Requirement of a commonly owned U.S. Patent Application, which issued as U.S. Patent 7,340,711.

Non-final Office Action of U.S. Appl. No. 11/457,272, Mar. 17, 2008 (mailing date), Wadland, et al., Non-final Office Action of a commonly owned pending U.S. Patent Application.

International Preliminary Report on Patentability (IPRP) for PCT/US2005/019361, Dec. 14, 2006 (mailing date), Cadence Design Systems, Inc., International Preliminary Report on Patentability (IPRP) of a commonly owned PCT Patent Application with listed as item #38 of the form.

International Preliminary Report on Patentability (IPRP) for PCT/US2005/019359, Dec. 14, 2006 (mailing date), Cadence Design Systems, Inc., International Preliminary Report on Patentability (IPRP) of a commonly owned PCT Patent Application with listed as item #37 of this form.

* cited by examiner

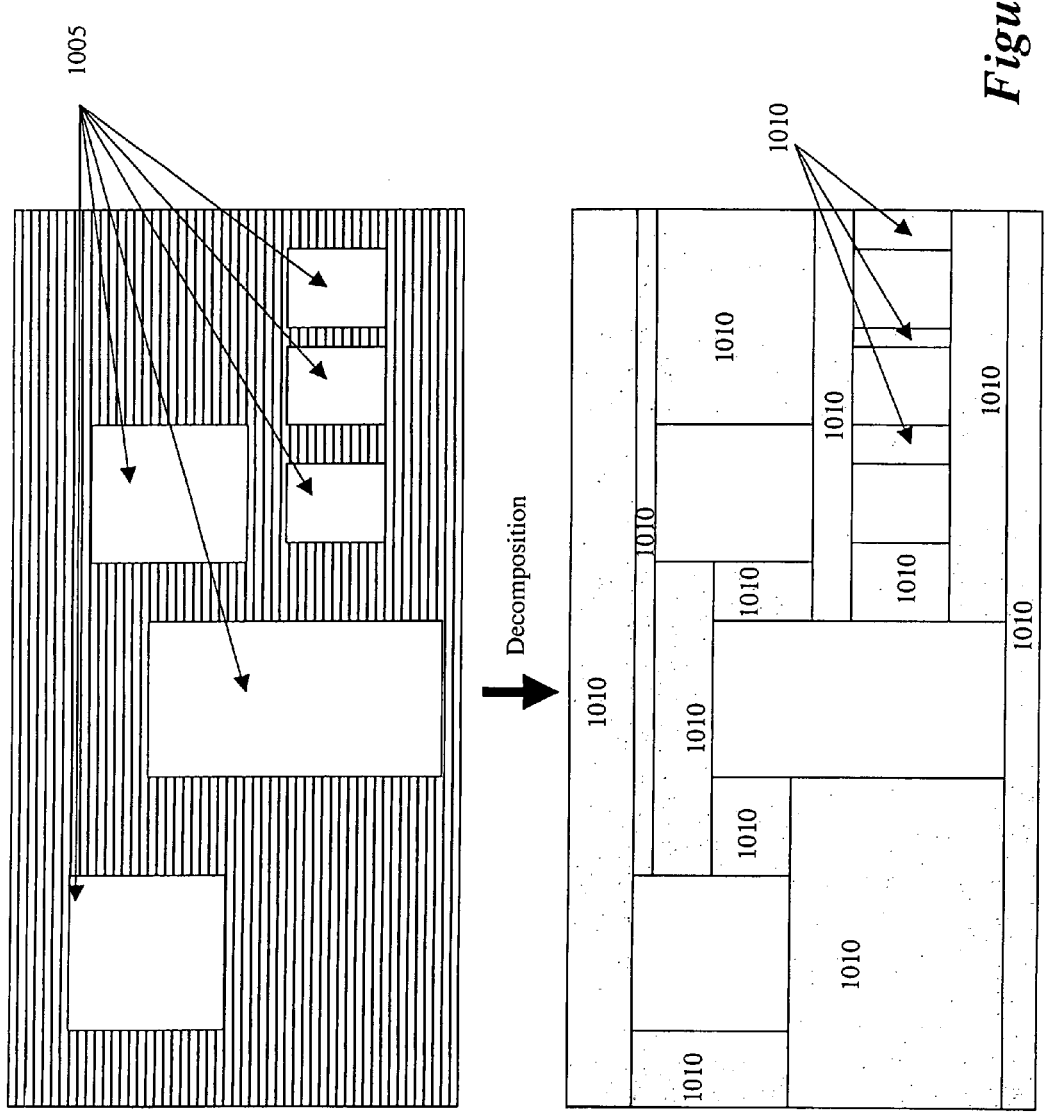

Jogs into the LPDR

Vias out

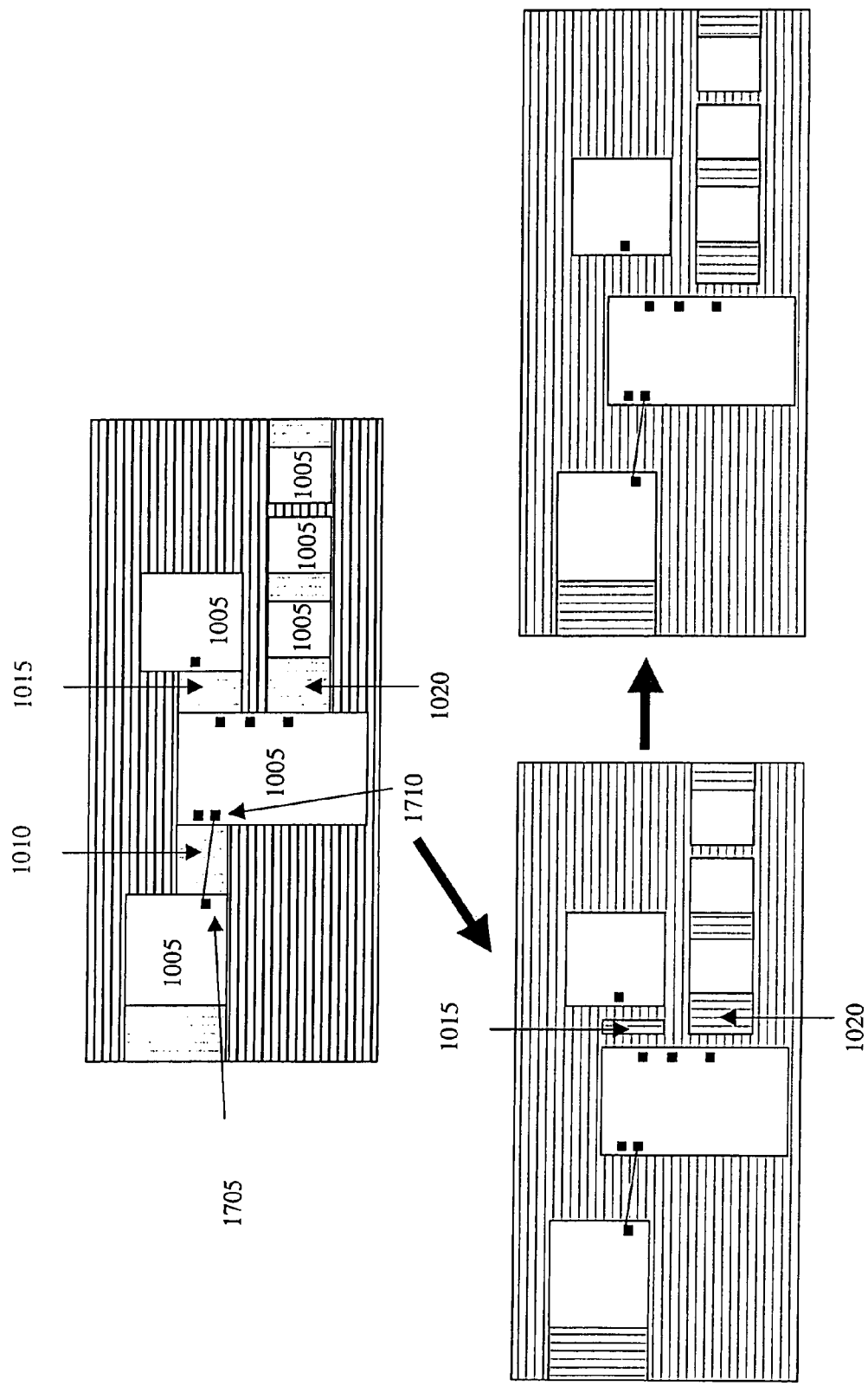

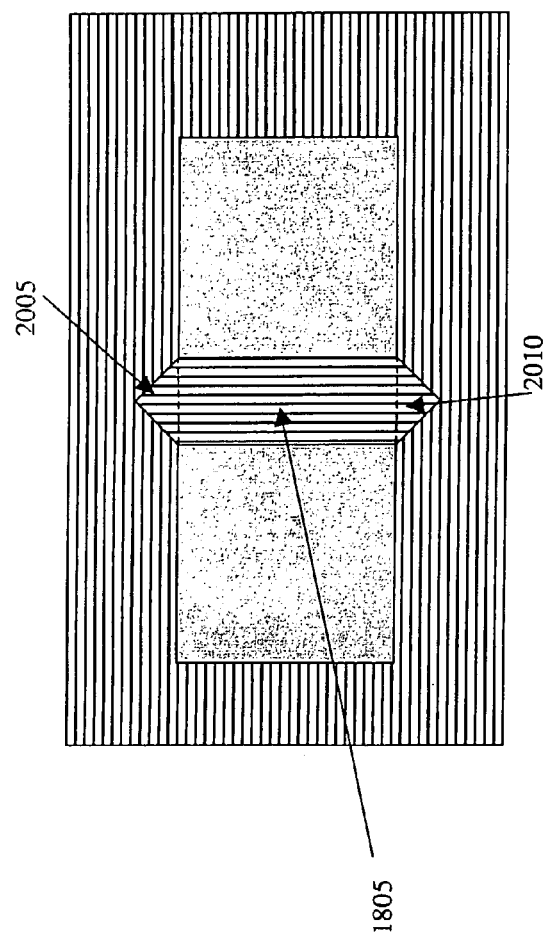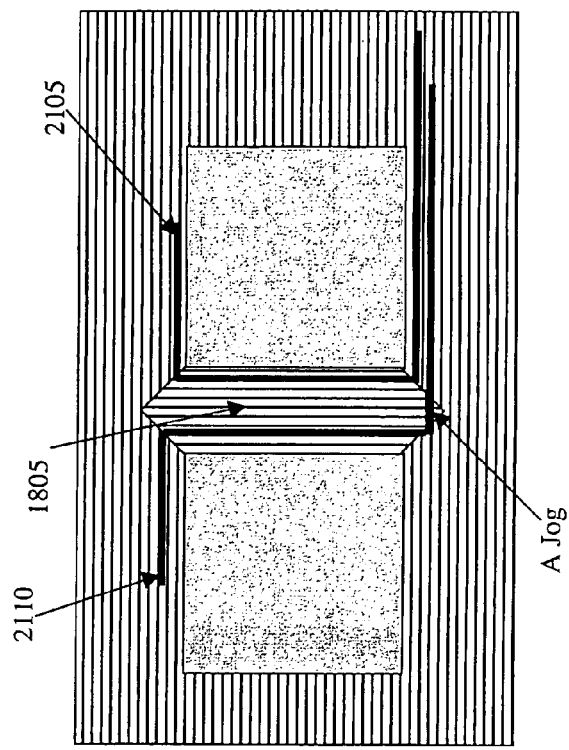

METHOD AND APPARATUS FOR GENERATING LAYOUT REGIONS WITH LOCAL PREFERRED DIRECTIONS

CLAIM OF BENEFIT TO PRIOR PROVISIONAL APPLICATION

This application claims the benefit of U.S. Provisional Patent Application 60/577,434, filed on Jun. 4, 2004.

CROSS REFERENCE TO RELATED APPLICATIONS

This Application is related to U.S. patent application Ser. No. 11/005,316, filed Dec. 6, 2004; U.S. patent application Ser. No. 11/005,169, filed Dec. 6, 2004; and U.S. patent application Ser. No. 11/005,448, filed Dec. 6, 2004.

BACKGROUND OF THE INVENTION

An integrated circuit ("IC") is a semiconductor device that includes many electronic components (e.g., transistors, resistors, diodes, etc.). These components are often interconnected to form multiple circuit components (e.g., gates, cells, memory units, arithmetic units, controllers, decoders, etc.) on the IC. An IC also includes multiple layers of metal and/or polysilicon wiring that interconnect its electronic and circuit components. For instance, many ICs are currently fabricated with five metal layers. In theory, the wiring on the metal layers can be all-angle wiring (i.e., the wiring can be in any arbitrary direction). Such all-angle wiring is commonly referred to as Euclidean wiring. In practice, however, each metal layer typically has one global preferred wiring direction, and the preferred direction alternates between successive metal layers.

Many ICs use the Manhattan wiring model that specifies alternating layers of horizontal and vertical preferred direction wiring. In this wiring model, the majority of the wires can only make 90° turns. Occasional diagonal jogs are sometimes allowed on the preferred horizontal and vertical layers. Standard routing algorithms heavily penalize these diagonal jogs (i.e. assess proportionally high routing-costs), however, because they violate the design rules of the Manhattan wiring model. Some have recently proposed ICs that use a diagonal wiring model to provide design rules that do not penalize diagonal interconnect lines (wiring). Interconnect lines are considered "diagonal" if they form an angle other than zero or ninety degrees with respect to the layout boundary of the IC. Typically however, diagonal wiring consists of wires deposed at ±45 degrees.

Typical Manhattan and diagonal wiring models specify one preferred direction for each wiring layer. Design difficulties arise when routing along a layer's preferred direction because of obstacles on these wiring layers. For example, design layouts often contain circuit components, pre-designed circuit blocks, and other obstacles to routing on a layer. Such obstacles may cause regions on a layer to become essentially unusable for routing along the layer's single preferred direction.

An example that shows obstacles that cause regions on a design layout to become unusable for routing is illustrated in FIG. 1. This figure shows two wiring layers that each have two routing obstacles 115 and 120. One of the layers has a horizontal preferred direction; the other layer has a diagonal preferred direction. The obstacles 115 and 120 cause two regions 105 and 110 to become unusable for routing on both of these layers. Therefore, both the Manhattan and diagonal wiring models typically waste routing resources on the layers of a design layout.

Accordingly, there is a need in the art for a wiring model that allows Manhattan and diagonal wiring and recaptures the routing resources lost because of obstacles on a wiring layer. More generally, there is a need for a route planning method that maximizes the routing resources on each particular layer.

SUMMARY OF THE INVENTION

Some embodiments of the invention provide a method for defining wiring directions in a design layout having several wiring layers. The method decomposes a first wiring layer into several non-overlapping regions. It assigns at least two different local preferred wiring directions to at least two of the regions. In some embodiment, the method decomposing the first wiring layer by using the vertices of items in the layout to decompose the layout. In some of these embodiments, the item include macro blocks. The method of some embodiments also identifies several power via arrays on the first wiring layer, and identifies a local preferred wiring direction based on the arrangement of the power via arrays on the first wiring layer.

BRIEF DESCRIPTION OF THE DRAWINGS

The novel features of the invention are set forth in the appended claims. However, for purpose of explanation, several embodiments of the invention are set forth in the following figures.

FIG. 1 illustrates an example that shows obstacles that cause regions on a design layout to become unusable for routing is illustrated in.

FIG. 10 illustrates an example of a decomposition operation on a layer with a horizontal global preferred direction.

FIG. 17 illustrates another example of the pin adjustment operation.

FIGS. 18-21 illustrate examples of impermeable boundaries between regions on a layer and examples of eliminating such boundaries by reshaping the regions.

DETAILED DESCRIPTION OF THE INVENTION

Figure 1:
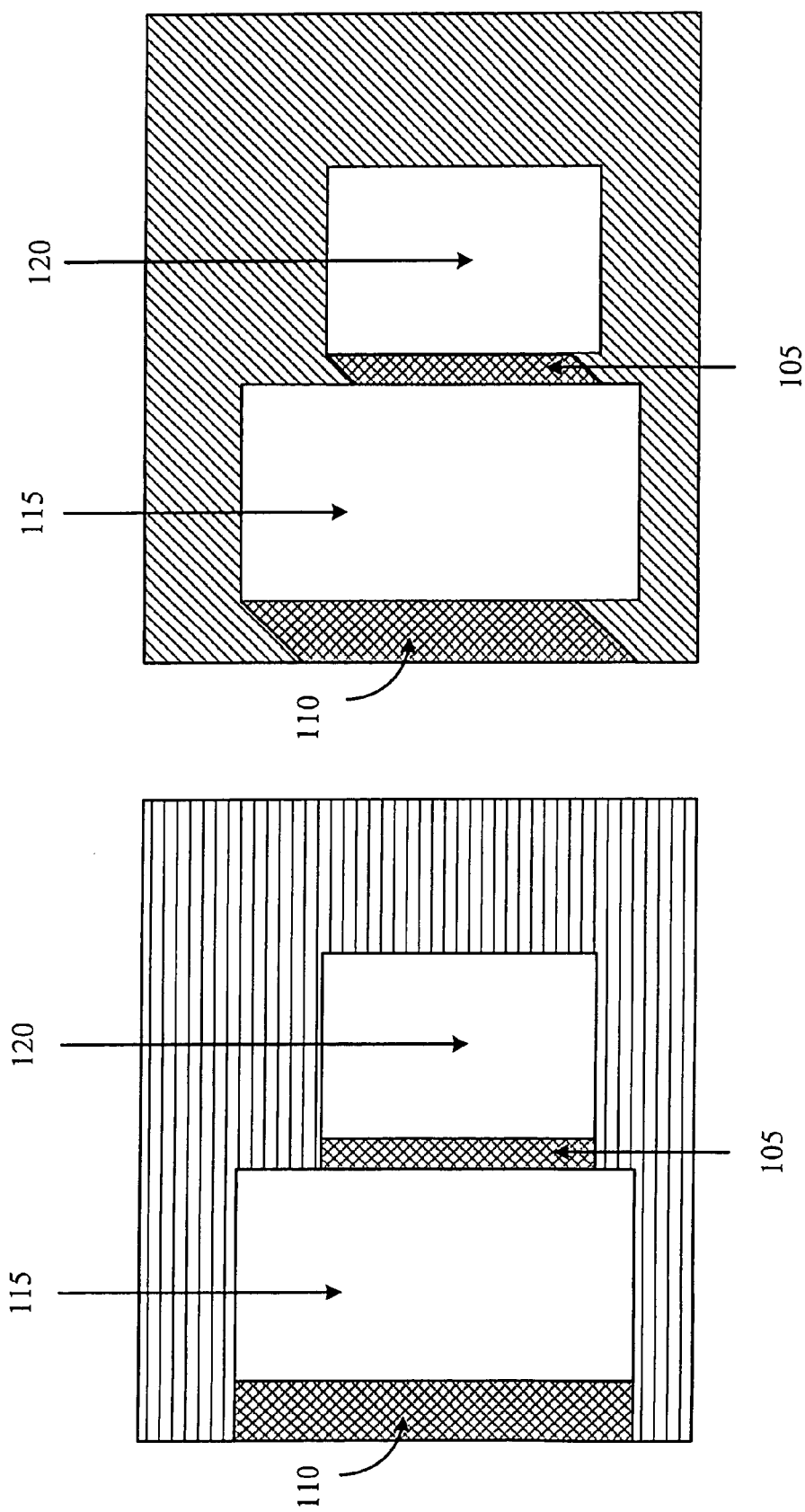

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

Some embodiments of the invention provide one or more Electronic Design Automation (EDA) tools that use a Local Preferred Direction (LPD) wiring model. An LPD wiring model allows at least one wiring layer to have several different local preferred directions in several different regions of the wiring layer.

Some embodiments provides a method for defining wiring directions in a design layout having several wiring layers. The method decomposes a first wiring layer into several non-overlapping regions. It assigns at least two different local preferred wiring directions to at least two of the regions. In some embodiments, the method decomposing the first wiring layer by using the vertices of items in the layout to decompose the layout. In some of these embodiments, the items include macro blocks. The method of some embodiments also identifies several power via arrays on the first wiring layer, and identifies a local preferred wiring direction based on the arrangement of the power via arrays on the first wiring layer.

Several features of the invention will be discussed below in Section II. However, before this discussion, Section I provides examples of LPD wiring models of some embodiments of the invention.

I. LPD Overview

A. Definitions

Several embodiments of the invention provide a router that routes a set of nets in a region of an integrated circuit ("IC") layout. Each routed net includes a set of routable elements in the IC-layout region. The routable elements are pins in the embodiments described below, although they might be other elements in other embodiments. The routes defined by some embodiments have "diagonal" edges. In some embodiments, a diagonal edge typically forms an angle other than 0° or 90° with respect to the layout's Cartesian coordinate axes, which are often parallel with the layout's boundary and/or the boundary of the layout's expected IC. On the other hand, a horizontal or vertical edge typically forms an angle of 0° or 90° with respect to one of the coordinate axes of the layout. The horizontal and vertical directions are referred to as the Manhattan directions.

Given a design layout with routing layers, some embodiments describe the wiring model of a layout in terms of (1) several wiring layers, (2) a global preferred direction $D_L$ for each layer L, and (3) a potentially-empty set of LPDs for each wiring layer L. Some embodiments define a "preferred" direction as the direction that a majority of the wires are laid out in a region. Some embodiments further quantify this amount in terms of percentages or amount of the wiring. For example, some embodiments define the preferred direction of a layer as the direction for at least 50% of the wires (also called interconnect lines or route segments) on the layer. Other embodiments define the preferred direction of a layer as the direction for at least 1000 wires on the layer.

Some embodiments of the invention use a five-layer wiring model that specifies the following global preferred directions: horizontal wiring on wiring layer 1, vertical wiring on wiring layer 2, horizontal wiring on wiring layer 3, +45° diagonal wiring on wiring layer 4, and −45° diagonal wiring (also referred to as 135° or D135 wiring) on wiring layer 5. One of ordinary skill will realize that other embodiments specify the global wiring directions differently or use a different number of wiring layers.

On a particular layer, a region is called an LPD region (or an LPDR) when the region has a local preferred wiring direction that is different than the global preferred wiring direction of the particular layer. In addition to the global preferred direction $D_L$, some embodiments define for each wiring layer L (1) at least 4 pitch values for use whenever a global or local preferred direction can be 0°, 45°, 90°, 135°; and (2) a possibly empty set of data tuples that represent regions on the layer that might have a local preferred direction that differs from the global preferred direction $D_L$ of the layer.

The pitch values describe the track pitch along a global or local preferred direction. In some embodiments, pitch values may change from layer to layer. Also, in some embodiments, each region's particular tuple t includes an "octangle" $O_t$ that represents the shape of the particular region, and a direction $d_t$ that represents the local preferred direction (i.e., 0°, 45°, 90°, 135°) of the particular region. Some embodiments allow a region's LPD $d_t$ to be the same direction as the global one.

An octangle in some embodiments is a data structure that is useful for design layouts that have items with horizontal, vertical, and/or ±45° directions. Specifically, in these embodiments, an octangle represents a convex geometric shape in terms of eight values, $x_{LO}$, $y_{LO}$, $s_{LO}$, $t_{LO}$, $x_{HI}$, $y_{HI}$, $s_{HI}$, and $t_{HI}$. These eight values define eight half-planes in two coordinate systems, where one coordinate system is a Manhattan coordinate system that is formed by an x-axis and a y-axis, and the other coordinate system is a 45°-rotated coordinate system that is formed by an s-axis and a t-axis. The s-axis is at a 45° counterclockwise rotation from the x-axis, while the t-axis is at a 135° counterclockwise rotation from the x-axis. In the layouts of some embodiments, horizontal lines are aligned with the x-axis, vertical lines are aligned with the y-axis, 45° diagonal lines are aligned with the s-axis, and −45° diagonal lines are aligned with the t-axis.

Octangles are further described in U.S. patent application Ser. No. 10/443,595 entitled "Method and Apparatus for Representing Items in a Design Layout," which published as U.S. Published Patent Application 2004-0225983A1. This patent application is incorporated herein by reference. In the description below, both the wiring and non-wiring geometries of the design layout are convex shapes, or can be decomposed into convex shapes, that have horizontal, vertical, and ±45° sides. One of ordinary skill will realize, however, that some embodiments might use the octangle data structure in cases where the wiring or non-wiring geometries are more restricted.

Some embodiments impose several consistency requirements on an LPD description. For instance, some embodiments require each LPD region to be entirely within the chip area. Also, in some embodiments, different LPD regions on a given layer can abut only at their boundary. In addition, in some embodiments, all LPD regions are non-degenerate, i.e. they contain at least one interior point.

Careless definition of LPDs can lead to curious consequences like a separated island on a plane that allows almost no wiring to enter or leave. Since EDA tools typically provide no intelligence about the intention or suitability of such a description, some embodiments of the invention implement an additional plausibility analysis as a separate checking stage that can be called from a Graphical User Interface (GUI) or a text-based interface (such as the Python Interface) in an initial planning stage.

A macro block is a complex pre-designed circuit block that is used in a layout. Examples of such blocks include IP Blocks, RAM cells, etc.

B. Examples

Figure 2:
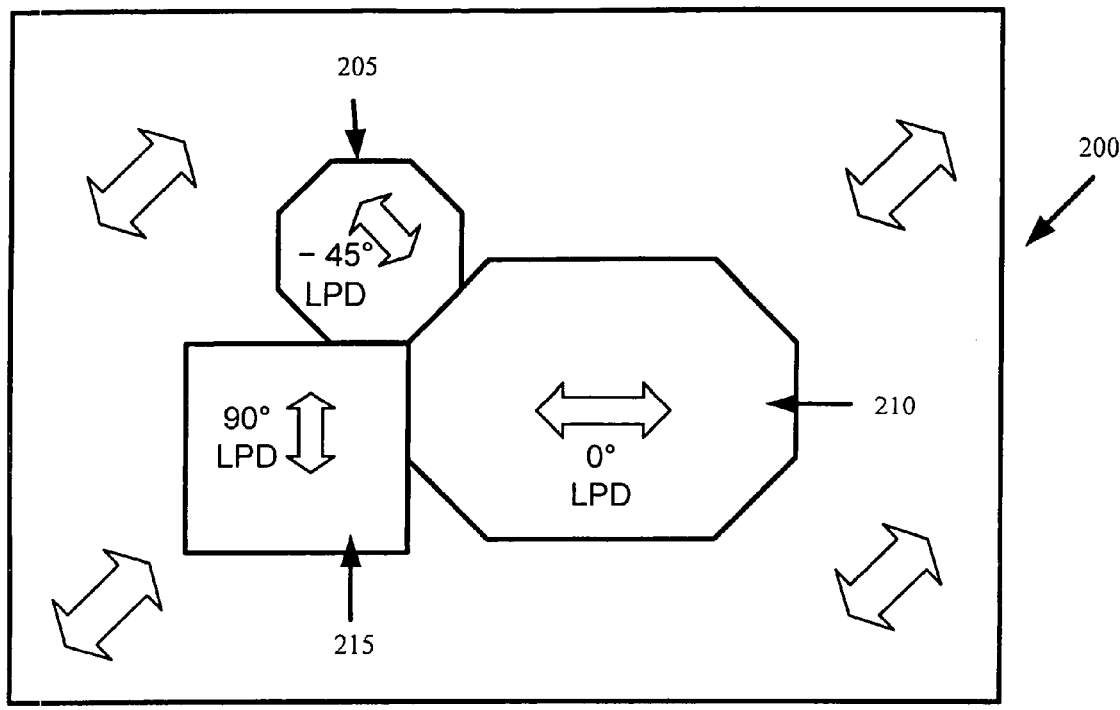
FIG. 2 illustrates an example of a design layout with several differently shaped local preferred direction (LPD) regions according to some embodiments of the invention.

An example of a design layout with several differently shaped LPD regions according to some embodiments of the invention is illustrated in FIG. 2. This example shows a wiring layer 200 having a 45° global preferred direction, an octagonal region 205 having a −45° local preferred direction, an octagonal region 210 having a horizontal (0°) local preferred direction, and a rectangular region 215 having a vertical (90°) local preferred direction.

Figure 3:
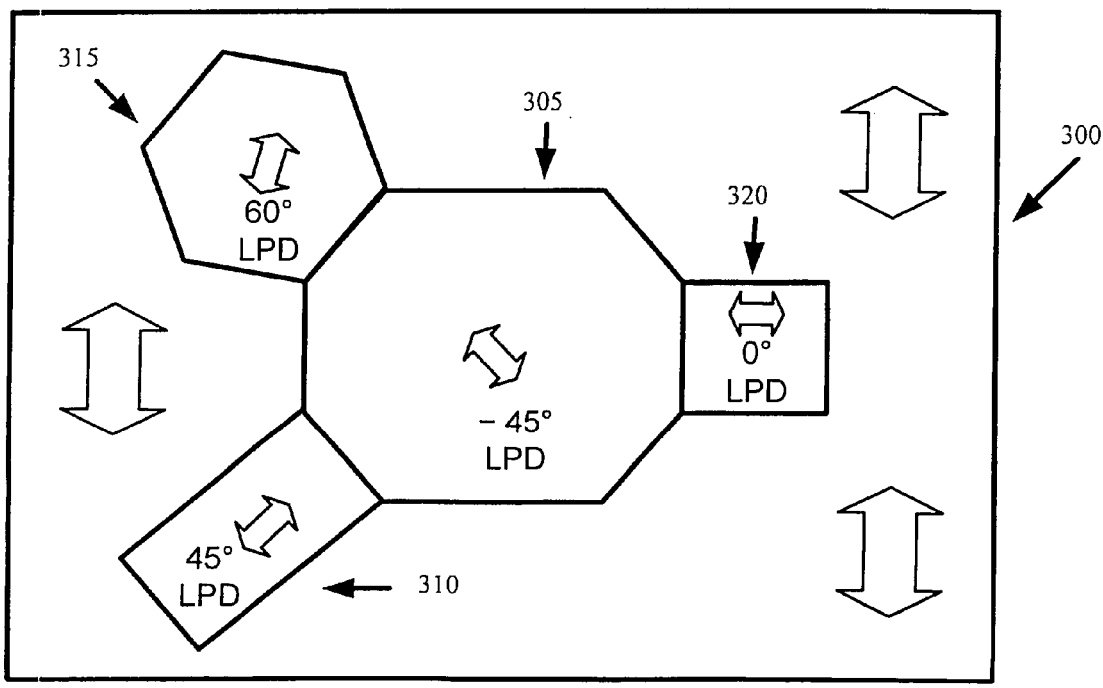
FIG. 3 illustrates another example of a wiring layer with several differently shaped LPD regions (LPDRs) according to some embodiments of the invention.

FIG. 3 illustrates another example of a wiring layer with several differently shaped LPD regions according to some embodiments of the invention. This example shows a wiring layer 300 having a 90° global preferred direction. The layer 300 has four LPD regions having different shapes and different local preferred directions. In the center of the layer 300 is an octagonal LPD region 305 having a −45° local preferred direction. Adjacent to the lower-left side of region 305 is a rectangular LPD region 310 having a 45° local preferred direction. Adjacent to the upper-left side of region 305 is a hexagonal LPD region 315 having a 60° local preferred direction. Adjacent to the right side of region 305 is a square LPD region 320 having a horizontal (0°) local preferred direction. This example illustrates the flexibility of the LPD wiring model when designing a wiring layer with different shaped LPD regions having different local preferred directions.

Figure 4A:
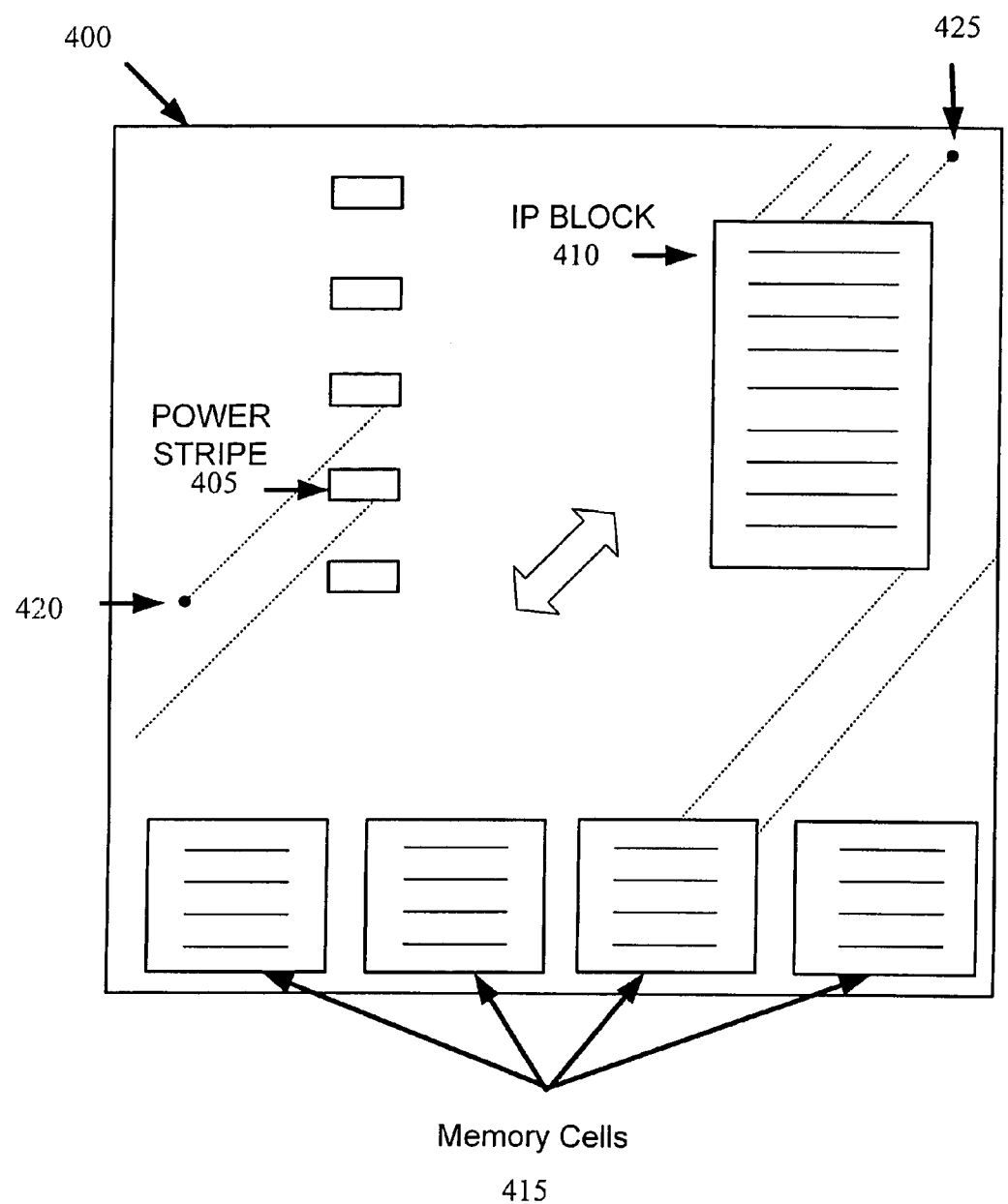
FIGS. 4A and 4B provide examples that illustrate the advantage of LPD wiring model in allowing routing resources normally lost due to obstacles on a wiring layer to be recovered.
Figure 4B:
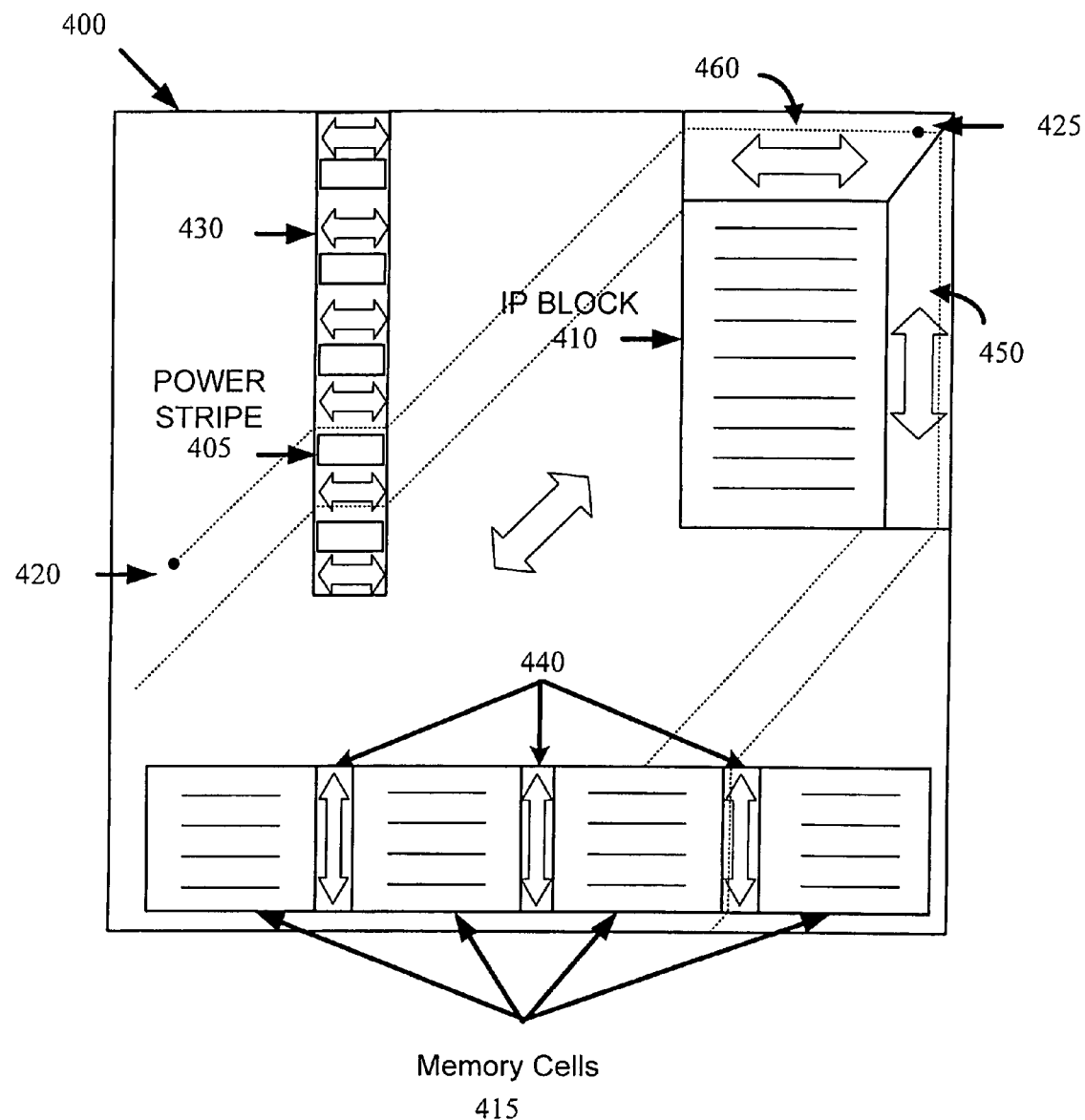

The examples illustrated in FIGS. 2 and 3 present simple cases of the LPD wiring model in a design layout. However, these examples do not illustrate any macros or other obstacles to the wiring on a layer. One of the advantages of the LPD wiring model is that it allows routing resources normally lost due to obstacles on a wiring layer to be recovered. FIGS. 4A and 4B provide examples that illustrate this advantage.

Specifically, FIG. 4A illustrates a wiring layer 400 having a diagonal global preferred direction. This wiring layer includes a column of power via arrays 405, an IP Block 410, a set of memory cells 415, and two pins 420 and 425. FIG. 4A also illustrates dotted lines that represent examples of diagonal wiring on the layer. The power stripe 405, IP Block 410, and the set of memory cells 415 are all obstacles to wiring on the wiring layer. For instance, as shown in FIG. 4A, a problem arises when pins 420 and 425 need to be connected to each other or to other pins, as the diagonal wiring that connects to pin 420 is obstructed by the power via arrays 405 while the diagonal wiring that connects to pin 425 is obstructed by the IP block 410.

In order to solve these routing problems, some embodiments define LPDRs about these obstacles with the LPDs of these regions different than the global preferred direction of the layer. FIG. 4B illustrates examples of such LPDRs. Specifically, this figure illustrates LPDRs 440 that are defined between the power via arrays and that have a horizontal (0°) LPD. Instead of defining an LPDR between each pair of the adjacent power via arrays, some embodiments define just one LPDR (with a horizontal LPD) that covers all the aligned power via arrays. This LPDR will have certain regions (i.e., the regions where the power via arrays exist) blocked for routing. These embodiments define only one LPDR in order to optimize the runtime processing of the LPDRs, as each LPDR takes up memory and computational resources.

FIG. 4B also illustrates LPD regions 435 that are between the RAM blocks 415 and that have a vertical (90°) LPD. In addition, an LPD region 430 having a vertical (90°) local preferred direction is defined between the right side of the IP Block 410 and the right boundary of the wiring layer, while an LPD region 445 having a horizontal (0°) local preferred direction is defined between the top side of the IP Block 410 and the top boundary of the wiring layer. The boundary between LPDR 430 and LPDR 445 is defined as a 45° diagonal line in order to increase the capacity of the wiring between two such regions. Defining such boundaries and the advantages of such boundaries will be further described below.

The LPD regions illustrated in FIG. 4B allow wiring that was previously obstructed to now traverse around the obstacles by routing through these LPD regions along their LPDs. For instance, as shown in FIG. 4B, pins 420 and 425 can now be connected through a set of interconnect lines that traverse along the global 45° direction, traverse through the LPDR 440 in the horizontal direction, traverse again along the global 45° direction, and then traverse through the LPDR 445 in the horizontal direction.

C. Joining Routes at LPD Borders

Figure 5:
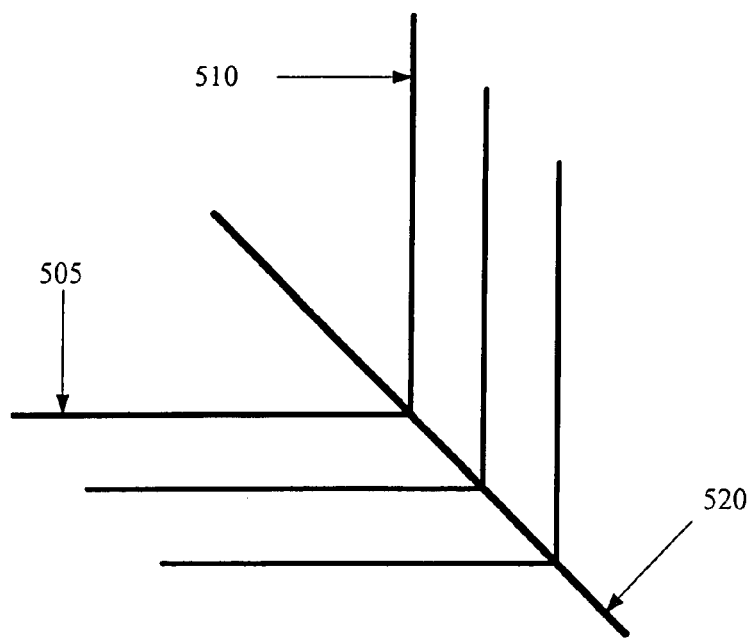
FIG. 5 illustrates an example of a joining model of some embodiments.

A common issue to address in LPD routing is how to join together route segments that traverse two different regions with two different LPDs on the same layer. Some embodiments of the invention join route segments together along a region that is neither parallel nor perpendicular to either route segment. FIG. 5 illustrates an example of such a joining model of some embodiments. In this figure, horizontal tracks 505 are located in a region with a horizontal local preferred direction, while vertical tracks 510 are located in a region with a vertical local preferred direction. As shown in FIG. 5, horizontal and vertical tracks are joined together along a diagonal region 520, which is a diagonal line in this example.

Figure 6:
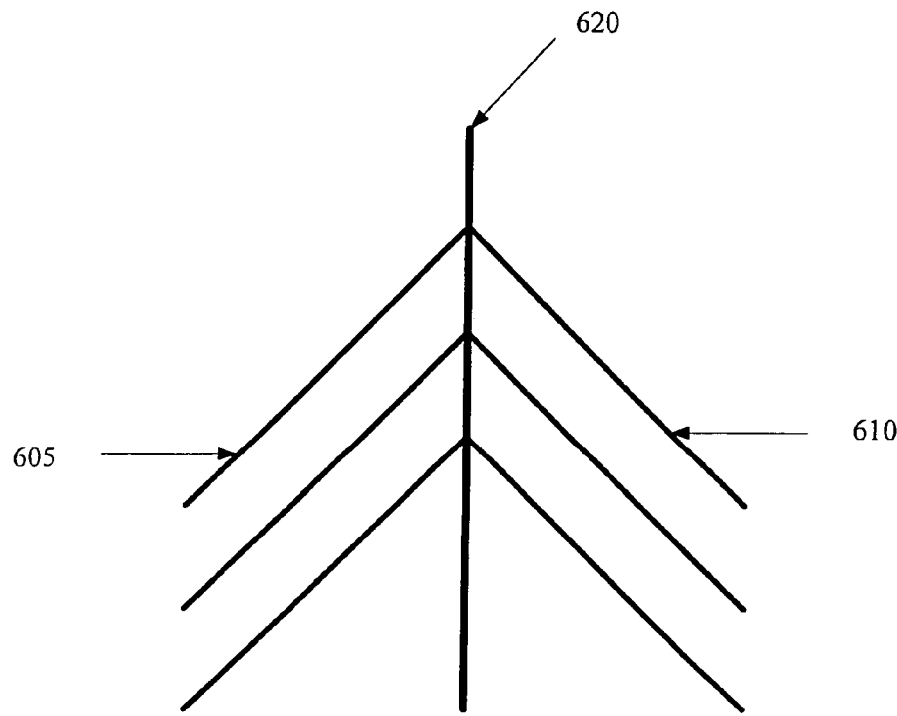
FIG. 6 illustrates another example of a joining model.

FIG. 6 illustrates another example of such a joining model. In this figure, +45° tracks 605 are located in a region with a +45° local direction, while −45° tracks 610 are located in a region with a −45° local direction. As shown in FIG. 6, 45° and −45° tracks are joined together along a vertical region 620, which is a vertical line in the example. Some embodiments manifest such joining models in terms of boundaries between the regions, as further described below in Section II.

D. Pitch

Some embodiments allow each LPDR to have its own set of pitch values. Other embodiments define a different pitch for each possible routing direction of each wiring layer. For instance, some embodiments define at least four (4) pitch values for each wiring layer, with one pitch value for each standard direction (horizontal, vertical, 45°, and 135°). In some embodiments, the distance between each track in each LPD region is set according to the pitch value corresponding to the routing direction in that region.

In some embodiments, the distance between any two parallel tracks is an integer multiple of the pitch, even when the two parallel tracks are in different LPDRs. Offset is the coordinate at the center of a routing track (e.g., it is the x-coordinate for vertical tracks). The offset of the tracks can be defined for each LPD or can remain undefined to be later determined by the detailed router. In either case, the track offsets are defined globally for each wiring direction on a layer. Thus, in some embodiments, there is a common offset for all parallel tracks within all LPD regions within a particular layer.

Pitches and offsets may vary from layer to layer. If the pitch for a particular region is left undefined, its value is estimated by applications (e.g., global and detailed routers). Some embodiments perform this estimation based on common utility functions that are dependent on minimum size net class and width/spacing of this net class. For example, if just one pitch is defined for a Manhattan direction X, the pitch for the other Manhattan direction Y is automatically estimated with the same value by all applications. The same applies for both diagonal directions. This means that if just the X-pitch is defined, the Y-pitch is defaulted to the same value as X-pitch. In some embodiments, the two diagonal pitches are derived from technology design rules, e.g., from the minimum spacing and width of the typical nets.

II. LPD Region Generation

Some embodiments of the invention include an LPDR generator that designates regions on one or more layers as LPD regions. In some embodiments, the LPDR generator automatically detects LPDR candidates and designates some of these candidates as LPD regions. In some of these embodiments, the LPDR generator also provides the designer with a graphical user interface that allows the designer to specify LPD regions and to modify the attributes (e.g., boundaries and LPDs) of these regions. In other embodiments, the LPDR generator does not perform any automatic detection and designation of LPDRs, but instead only provides the designer with a GUI that allows the designer to specify and modify LPDRs. Also, some embodiments allow a user to define and manipulate LPDRs and LPDs through text-based interfaces, such as a Python Interface.

The auto-LPDR generator of some embodiments is intended to make use of LPDRs to increase the routing resources without forcing the user to understand and create LPDRs. As discussed above, LPD creation targets regions that lack routing resources along the global preferred wiring direction of the layer. Such regions typically exist in the alleys between closely placed macros and/or between a macro and the layout's boundary. Also, such regions can be defined between power via arrays used to distribute power in the layout. Sub-section 1 below first describes defining LPDRs based on macros, and then sub-section 2 describes defining LPDRs between power via arrays. It should be noted that some embodiments first define LPDRs between the power via arrays, and then define LPDRs based on macros. Alternatively, some embodiment define these LPDRs together.

A. Macros

Figure 8:
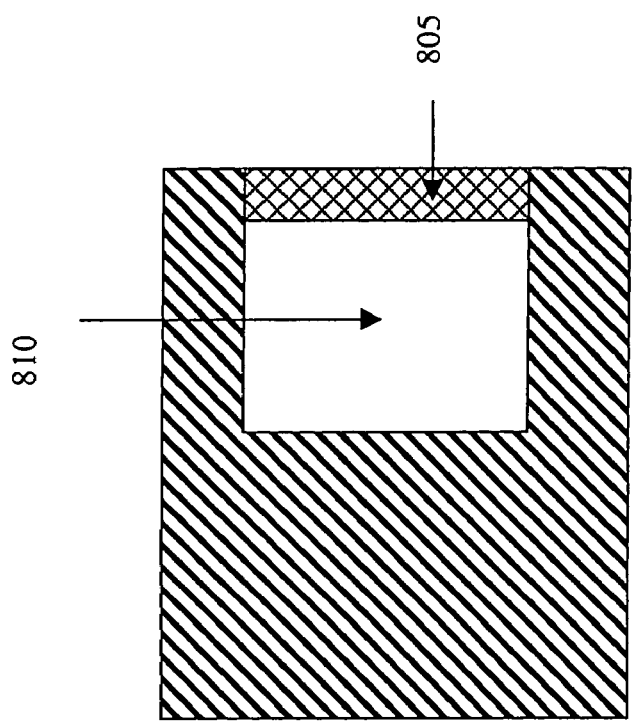
FIGS. 7 and 8 illustrate examples of regions that are between macros or between macros and the layout boundary and that would benefit from LPD wiring.
Figure 7:
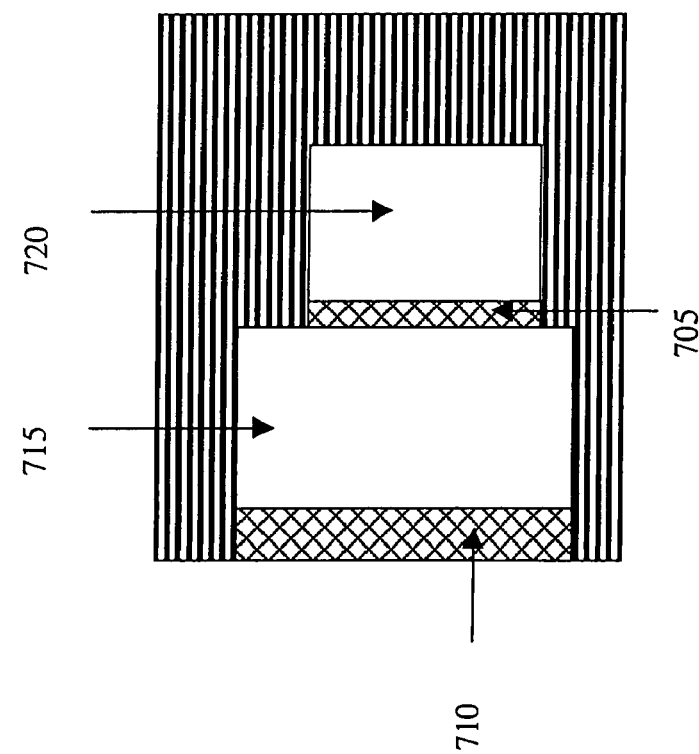

FIGS. 7 and 8 illustrate examples of regions that are between macros or between macros and the layout boundary and that would benefit from LPD wiring. Specifically, FIG. 7 illustrates two macro blocks 715 and 720 on a layer with a horizontal global preferred direction. As shown in this figure, the region 705 between the two macros and the region 710 between the macro 715 and the layer boundary provide small amounts of routing space, which are not particularly useful given the horizontal global preferred direction of the wiring on the layer. FIG. 8 illustrates a region 805 between a macro 810 and the boundary of a layer with a 45° diagonal wiring. Like the regions 705 and 710 of FIG. 7, the regions 805 provides a small amount of routing space that is not particularly useful given the 45° global preferred direction of the wiring on the layer. Hence, to make use of regions 705, 710, and 805, the preferred wiring directions of these regions should be specified differently from the global preferred wiring direction of their layer.

Figure 9:
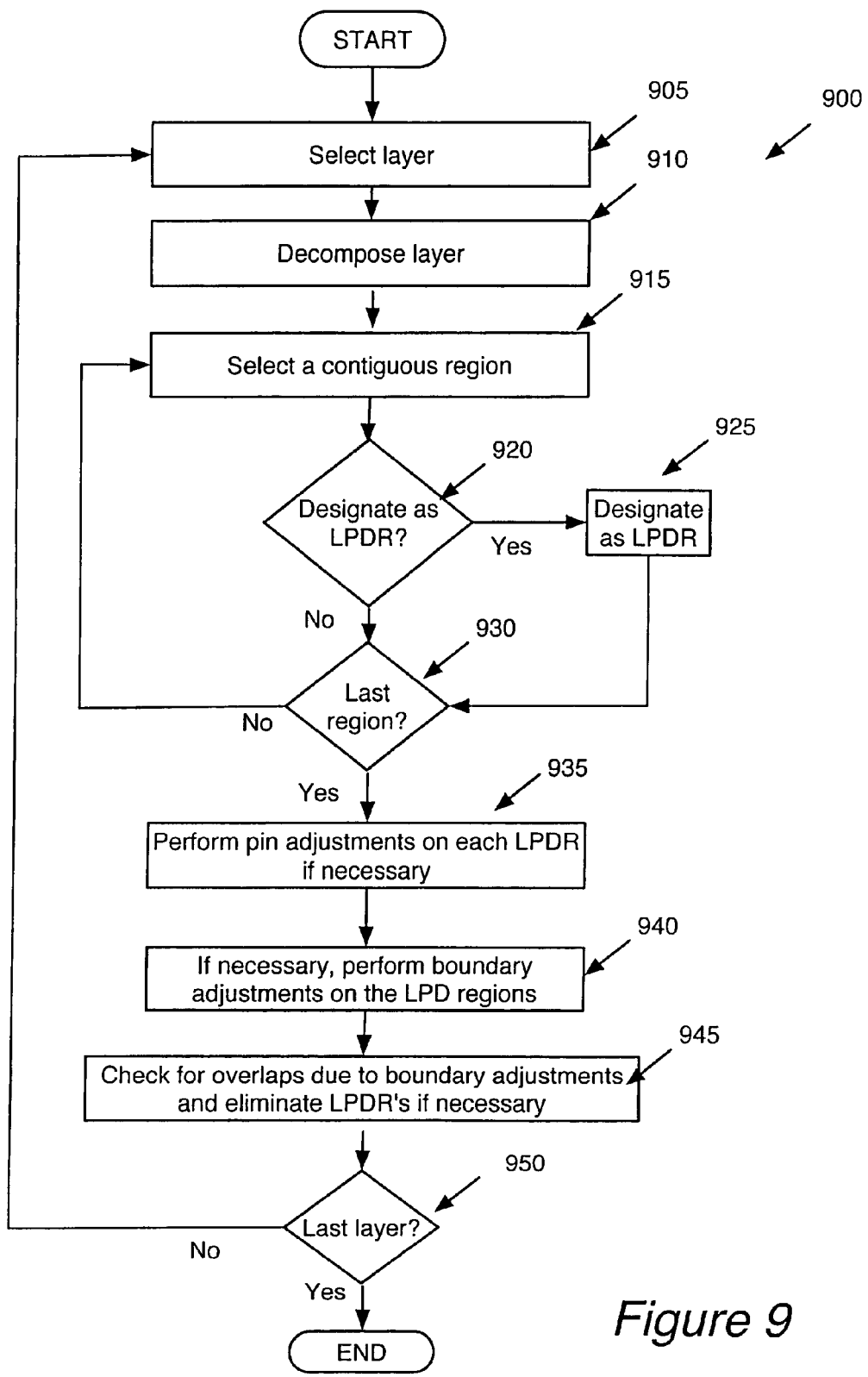
FIG. 9 illustrates an auto-LPDR generation process that is used by some embodiments to generate LPDRs in a layout.

FIG. 9 illustrates an auto-LPDR generation process 900 that is used by some embodiments to generate LPDRs in a layout. This process: (1) identifies candidate regions, (2) designates some or all of the candidate regions as LPDRs, (3) adjusts the LPDRs for pin access, and (4) modifies LPDRs to improve routability between LPDRs and between LPDRs and non-LPDR regions on a layer. This process is described in terms of several examples that relate to LPDR generation on layers with Manhattan global preferred directions.

As shown in FIG. 9, the process 900 starts by selecting (at 905) a layout layer. The process then decomposes (at 910) the layout layer into several regions. In some embodiments, the process decomposes the selected layout layer by projecting rays from the corner vertices of the outline of the macro blocks on the selected layer. The outlines of the macro blocks might have been defined prior to 910 or they might be defined at 910 based on the shape and structure of the content of the macro blocks.

The projected rays are in the direction of the global preferred wiring direction of the selected layer. FIG. 10 illustrates an example of a decomposition operation on a layer with a horizontal global preferred direction. In this example, the layer has six macros 1005. Rays are projected from the vertices of these six macros in the horizontal global preferred direction. These projections define thirteen candidate LPD regions 1010.

After 910, the process then selects (at 915) one of the contiguous regions created through the decomposition. It then determines (at 920) whether it should designate the selected region as an LPDR for a particular local preferred direction. In some embodiment, the process makes this determination by applying a set of geometric criteria. The criteria are meant to ensure that the designation of the selected region as an LPDR does not remove routing resources from a layer, that usable resources are created by the local preferred direction of the LPDR, and that sufficient additional resources get created in order to justify the extra runtime and/or memory cost of including an LPDR.

In some embodiments, the criteria for defining LPDRs on a layer with a horizontal global preferred direction is:

$W_{Max} \geq$ Width of Region $\geq W_{Min}$, and

Length of Region $\geq L_{min}$, where the width of the region is in the horizontal direction, the length of the region is in the vertical direction, $W_{Max}$ and $W_{Min}$ are upper and lower limits on the width of the region, and $L_{Min}$ is a lower limit on the length of the region. The lower limit on region width ensures that the amount of additional vertical or diagonal resource is worth the cost of LPDRs. The upper limit on region width ensures that significant horizontal resources are not lost. Finally, the lower limit on the region's length ensures that the region is not too short, as vertical or diagonal tracks that are smaller than some length might not be of any significant use. This way the additional vertical or diagonal routes will have significant movement along the vertical or diagonal direction.

In some embodiments, the criteria for defining LPDRs on a layer with a vertical global preferred direction is:

$L_{Max} \geq$ Length of Region $\geq L_{Min}$, and

Width of Region $\geq W_{Min}$.

Again, the width of the region is in the horizontal direction, the length of the region is in the vertical direction, $L_{Max}$ and $L_{Min}$ are upper and lower limits on the length of the region, and $W_{Min}$ is a lower limit on the width of the region. The lower limit on region length ensures that the amount of additional horizontal or diagonal resource is worth the cost of LPDRs. The upper limit on region length ensures that significant vertical resources do not get lost. Finally, the lower limit on the region's width ensures that the region is not too thin, as horizontal or diagonal tracks that are smaller than some length might not be of any significant use. This way the additional horizontal or diagonal routes will have significant movement along the horizontal or diagonal direction. Some embodiments define the criteria for defining LPDRs on a layer with diagonal global preferred directions similarly.

If the process determines (at 920) that the selected region is not a good candidate for an LPDR, the process transitions to 930, which will be described below. On the other hand, when the process determines (at 920) that the selected region is a good LPDR candidate, it transitions to 925, where it designates the selected region as an LPDR. At 925, the process also designates the LPD of the selected region.

Figure 11:
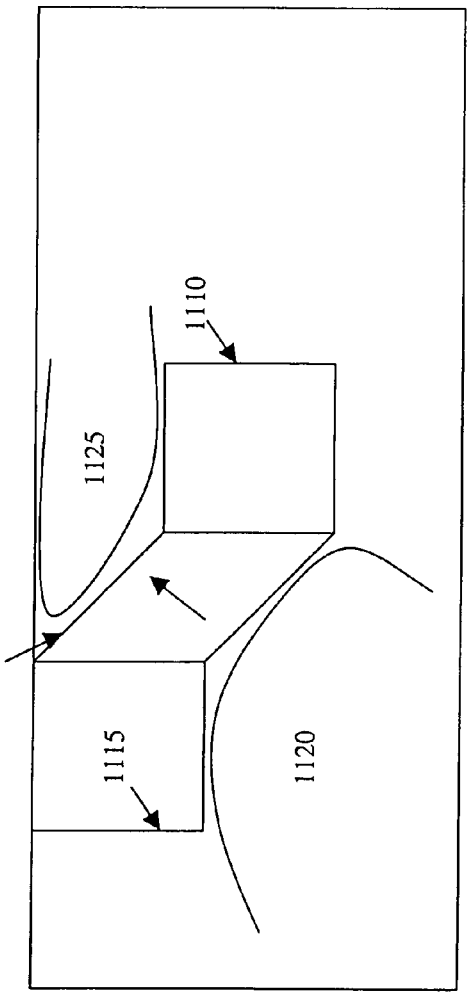
FIG. 11 illustrates a 45° LPD for an LPDR that is defined between two macro blocks that are diagonally offset from each other.

For a layer that has a Manhattan global preferred direction, some embodiments define the LPD of a designated LPDR on that layer as the Manhattan direction that is orthogonal to the layer's Manhattan global preferred direction. On a layer that has a diagonal global preferred direction, some embodiments define the LPD of a designated LPDR on that layer as one of the Manhattan directions. This Manhattan direction might be a direction that is identified by the dimensional attributes (e.g., orientation) of the LPDR. For instance, when the LPDR is a tall and narrow rectangle aligned with the y-axis, the LPD direction might be designated as the vertical direction. Alternatively, some embodiments define the LPD of an LPDR on any layer based on the dimensional attributes of the LPDR. Also, some embodiments define the LPD of an LPDR that is defined between two or more macro blocks based on the positional relationship of the macro blocks. For instance, FIG. 11 illustrates a 45° LPD for an LPDR 1105 that is defined between two macro blocks 1110 and 1115 that are diagonally offset from each other, because it facilitated routing between the open areas 1120 and 1125 to reduce the impact of the macroblocks.

Figure 12:
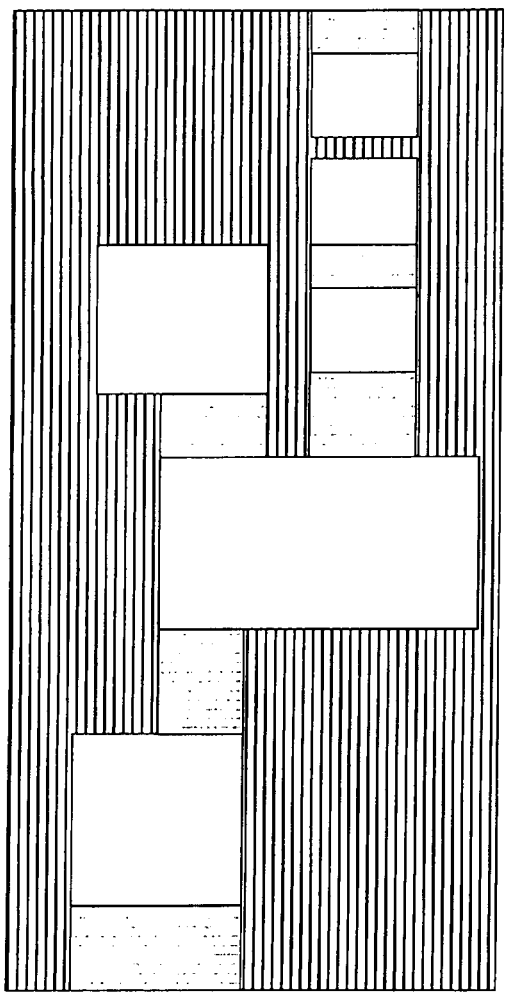
FIG. 12 illustrates the elimination of several candidate LPD regions, which were created in the tessellation illustrated in FIG. 10.

FIG. 12 illustrates the elimination of several candidate LPD regions, which were created in the tessellation illustrated in FIG. 10, for failing to satisfy the above-described width and length criteria. In this example, the remaining LPDRs (i.e., the LPDRs illustrated in this figure) all have been assigned a vertical LPD.

After 925, the process transitions to 930. At 930, the process determines whether it has examined all the contiguous regions created on the selected layer by the decomposition operation at 910. If not, the process selects (at 915) another contiguous region, determines (at 920) whether this region should be designated as an LPDR, and (3) in case of an affirmative determination at 920, designates (at 925) the selected region as an LPDR.

When the process determines (at 930) that it has examined all the contiguous regions created on the selected layer by the decomposition operation at 910, the process examines (at 935) each particular region that it designated (at 925) as an LPD region to determine whether it needs to adjust or eliminate this region based on pins at the boundaries of the particular region.

Figure 13:
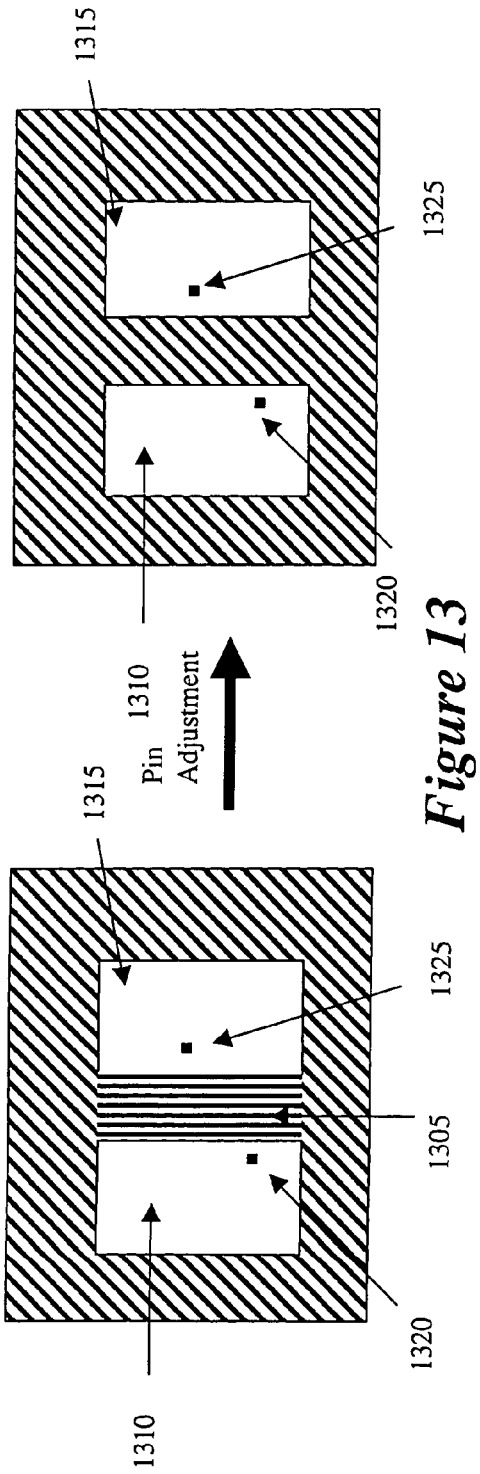
FIG. 13 presents an example of an LPDR that is created on a layer between two macros.

The newly created LPDRs should not hinder pin access. Hence, the process 900 needs to ensure that the LPDRs provide a safe distance for access to the pins. Accordingly, for each particular LPDR defined at 925, the process initially determines (at 935) whether there is at least one pin on one side of the particular LPDR that needs to connect to another pin on another side of the LPDR. If so, the process discards the LPDR in some embodiments, as the LPDR would block the easiest way to connect the two pins. FIG. 13 presents an example of an LPDR 1305 that is created on a layer between two macros 1310 and 1315. On the two sides of the LPDR 1305, the two macros have two pins 1320 and 1325 that need to connect. Hence, as shown in FIG. 13, the pin adjustment operation at 935 removes the LPDR 1305 from the layout. Instead of discarding (at 935) an LPDR, the process 900 in some embodiments tries to modify (at 935) the shape of the LPDR (e.g., tries to make the LPDR narrower or shorter as further described below) when it determines that there is one pin on one side of the particular LPDR that needs to connect to another pin on another side of the LPDR. If the modification fails to lead to an acceptable solution, the process then discards the LPDR in some embodiments.

The process 900 also identifies (at 935) each LPDR defined at 925 that has one or more pins on its sides even when the pins do not need to connect across the LPDR. For each such LPDR, the process (1) changes the shape of the LPDR to create one or more open corridors for pin access, and (2) then determines whether the modified LPDR still satisfies the above-mentioned criteria for creating the LPDR. If the modified LPDR no longer satisfies one or more of the criteria (e.g., the modified LPDR's width is smaller than the required minimum width), the process discards the LPDR. Otherwise, the process keeps the LPDR with its modified shape.

Figure 14:
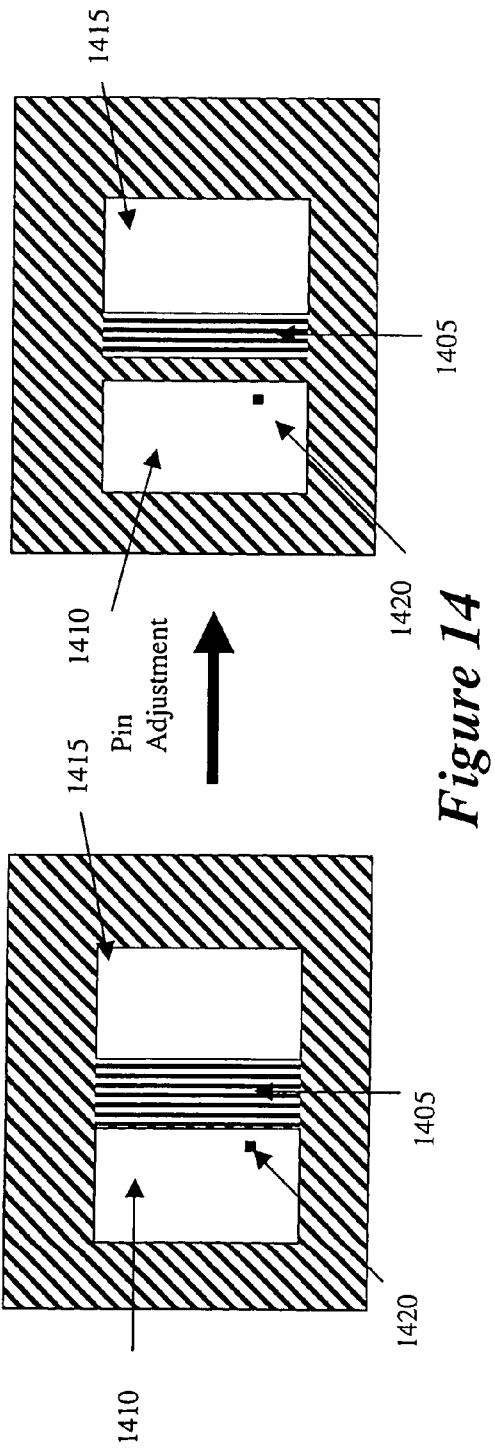
FIG. 14 illustrates an example of a pin adjustment operation that modifies the shape of an LPDR.

FIG. 14 illustrates an example of a pin adjustment operation that modifies the shape of an LPDR. Specifically, this figure presents an example of an LPDR 1405 that is created on a layer between two macros 1410 and 1415. On one side of the LPDR 1405, the macro 1410 has a pin 1420 that needs to be connected. Hence, as shown in FIG. 14, the pin adjustment operation at 935 makes the LPDR 1405 narrower (i.e., reduces its width).

Figure 16:
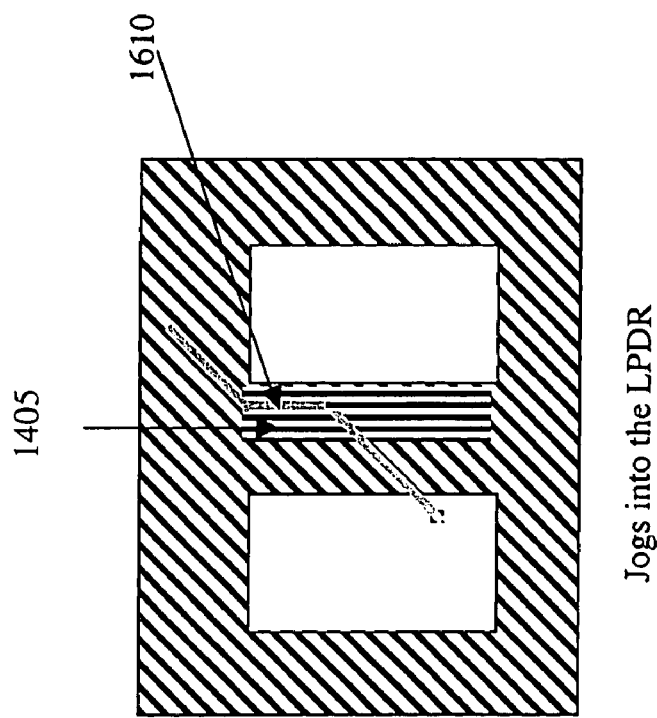
FIG. 16 illustrates an example of how some embodiments allow access to the pin through a 45° jog into the modified LPDR, a vertical traversal through this LPDR, and then traversing back in the 45° direction after leaving the LPDR.
Figure 15:
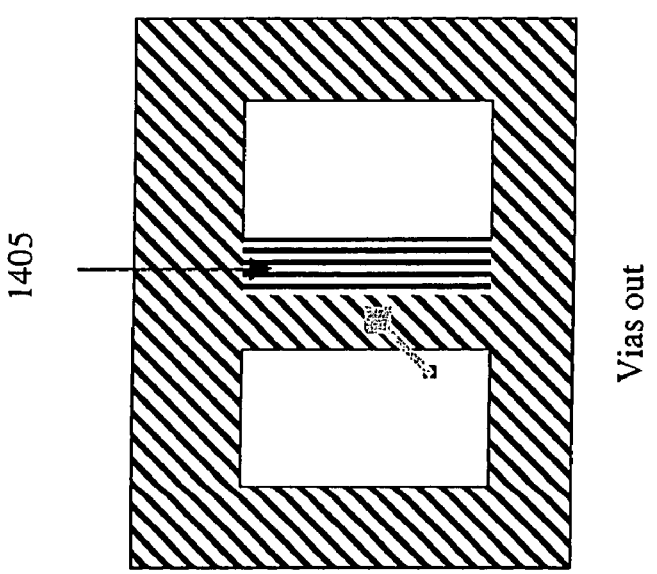
FIG. 15 illustrates an example that shows the use of the corridor created by the adjustment for a via access to the pin. For this modification.

Modifying the shape of an LPDR provides sufficient routing flexibility for accessing the pins. This leeway can be used by routes to either via out of the layer (the way they would have done without LPDRs) or to jog into the LPDR and blend into the flow. For the LPDR modification illustrated in FIG. 14, FIG. 15 illustrates an example that shows the use of the corridor 1405 created by the adjustment for a via access to the pin. For this modification, FIG. 16 illustrates an example of how some embodiments allow access to the pin through a 45° jog 1610 into the modified LPDR 1405, a vertical traversal through this LPDR, and then traversing back in the 45° direction after leaving the LPDR. Given that jog 1610 is not along a the LPD of the region 1405, some embodiments assess this jog a penalty for traversing a portion of this region along its non-preferred direction.

The amount that a dimension of the LPDR is adjusted is dependent on the number of pins on the side or sides of the LPDR that are associated with that dimension. For instance, some embodiments deduct the following distance D from each side of an LPDR region:

$$D = \text{Max}(S_{Min}, P_{Max} * \text{pitch} * C_{Pin})$$

where $P_{Max}$ is the number of pins along the edges of the LPDR, pitch is the wiring pitch along the global preferred direction, $C_{Pin}$ is a pin routing cost that is a heuristic parameter that quantifies the cost of a number of tracks that have to be left aside per pin, and $S_{Min}$ is the minimum spacing requirement for pin access, which is defined by the design rules. Some embodiments drop the min-spacing requirement from the above formula in order to simplify it as follows:

$$D = P_{Max} * \text{pitch} * C_{Pin}$$

Some embodiments might use different rules for performing pin adjustments on layers with diagonal global preferred directions than on layers with Manhattan global preferred directions. For instance, some embodiments may choose to maintain the diagonal direction in a vertically/horizontally shaped region and hence may discard an LPDR when there is a pin at the boundary of the LPDR.

FIG. 17 illustrates another example of the pin adjustment operation. This example is a continuation of the examples illustrated in FIGS. 10 and 12. The top layout illustration in FIG. 17 presents several pins on the sides of the macros 1005. Next, the bottom left layout illustration in FIG. 17 shows the elimination of LPDR 1010. This LPDR was eliminated because two pins 1705 and 1710 on its sides need to be connected to each other. The bottom left layout also illustrates the narrowing of LPDRs 1015 and 1020 to create corridors for accessing pins on the side of these two LPDRS. Finally, the bottom right layout in FIG. 17 illustrates the elimination of the narrowed LPDR 1015 for failing to satisfy the minimum width criteria for a vertical LPDR.

After performing the pin adjustment operation at 935, the process performs a boundary adjustment operation at 940. In some embodiments, the routability between two regions is dependent on their routing directions and the orientation of the edge separating the two regions. Specifically, when one of the wiring directions between two regions on a layer is parallel to a boundary between the two regions, then some embodiments define the capacity at the boundary between two regions as zero. Such a boundary is referred to as an impermeable boundary between the two wiring directions.

Figure 18:
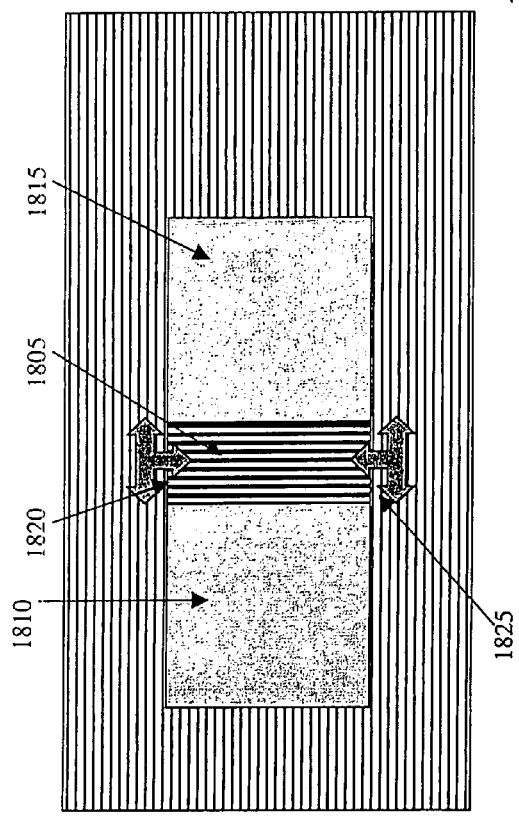
Figure 19:
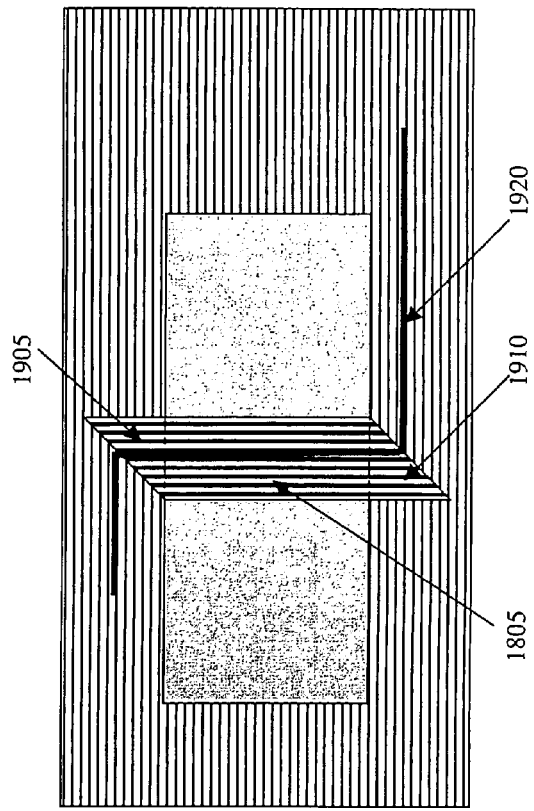

To avoid such impermeable boundaries, the process 900 performs the boundary adjustment operation at 940 that changes the boundary between two regions to eliminate any impermeable boundaries between them. FIGS. 18-20 illustrate examples of impermeable boundaries between regions on a layer and examples of eliminating such boundaries by reshaping the regions. Specifically, FIG. 18 illustrates a layer with a horizontal global preferred wiring direction and a LPDR 1805 between two macros 1810 and 1815. As shown in this figure, the LPDR 1805 has a vertical LPD. The LPDR 1805 also has horizontal top and bottom sides 1820 and 1825 that are parallel to the horizontal global preferred wiring direction of the layer. Accordingly, some embodiments define the wireflow capacity across the top and bottom sides 1820 and 1825 as zero (i.e., define these sides as impermeable sides). Such a wireflow definition is a conservative definition as a detailed router might allow non-preferred direction jogs at such boundaries.

The permeability at the boundary of the LPDR 1805 and the region with the global preferred wiring direction can be improved by modifying the shape of this boundary. For instance, FIG. 19 illustrates the addition of triangular crown regions 1905 and 1910 to the top and bottom sides of the LPDR 1805. Each triangular crown extension of the LPDR 1805 includes a 45° edge and a vertical edge. In some embodiments, the 45° edge is a permeable edge for routes to enter and exist the LPDR, while the vertical edge is an impermeable edge as it is parallel to the vertical LPD of the LPDR 1805. FIG. 19 illustrates an example of a route 1920 that traverses through the LPDR 1805 through its permeable edges.

FIG. 20 illustrates the additions of alternative triangular crown regions 2005 and 2010 to the top and bottom sides of the LPDR 1805. Each of these triangular crown extensions of the LPDR 1805 includes two 45° edges, both of which are in some embodiments, permeable edges. FIG. 21 illustrates two routes 2105 and 2110 that enter the LPDR 1805 through these permeable edges. However, as shown in FIG. 21, the route 2105 includes a non-preferred direction jog in the LPDR 1805. Hence, the added advantage of the two extra permeable edges that are provided by the crown extensions 2005 and 2010 come at the expense of requiring some routes to have non-preferred direction jogs in the LPDR.

LPDR crown extensions provide well-defined bending points for the routes. These well-defined points are only as strict as the layer direction itself. Accordingly, in some embodiments, the same kind of jogs that can run orthogonal to a routing direction can also violate the bending points in case the benefit offsets a higher price of a non-preferred-direction jog.

Some embodiments use the following approach to modify an impermeable boundary of an LPDR on a Manhattan layer. The impermeable boundary of the LPDR abuts two edges of the LPDR that abut the boundary edges of the layer or of macros on the layer. Each of these two edges is checked to determine whether it can be extended. This involves checking the bounds of the macro's edge next to it. The end-point of the edge is termed extendible if the edge can be elongated at that end-point without extending beyond the macro's edge. The amount, by which the edge needs to extend for stretching up to the obstruction edge, is the ExtendLimit. The extendibility and the ExtendLimit are determined at four points, which are two endpoints of both the edges.

The following description provides an example of the stretching logic that is performed to stretch a vertically shaped LPDR. When the LPDR can be extended at both its left top corner and right top corner, then the process discards the LPDR as there was some error in its creation. Alternatively, when the LPDR can be extended at its left top corner but not its right top corner, then the process stretches the LPDR's left edge upwards by the minimum of the LPDR width and a maximum top stretch limit. If the LPDR's left edge cannot be stretched by this minimum amount, then the LPDR is discarded in some embodiments.

When the LPDR can be extended at its right top corner but not its left top corner, then the process stretches the LPDR's right edge upwards by the minimum of the LPDR width or a maximum top stretch limit. If the LPDR's right edge cannot be stretched by this minimum amount, then the LPDR is discarded in some embodiments. When the left and right top corners of the LPDR cannot be extended, then the process connects the left edge and the right edge by a 45° edge and a 135° edge respectively. The 45° and 135° edges should not exceed the top stretch limit. If truncated, a horizontal line should connect the 45° and 135° edges. Stretching the bottom boundary of a vertical LPDR or the right and left sides of a horizontal LPDR follows an analogous set of operations for the bottom, right, and left sides of an LPDR.

Figure 22:
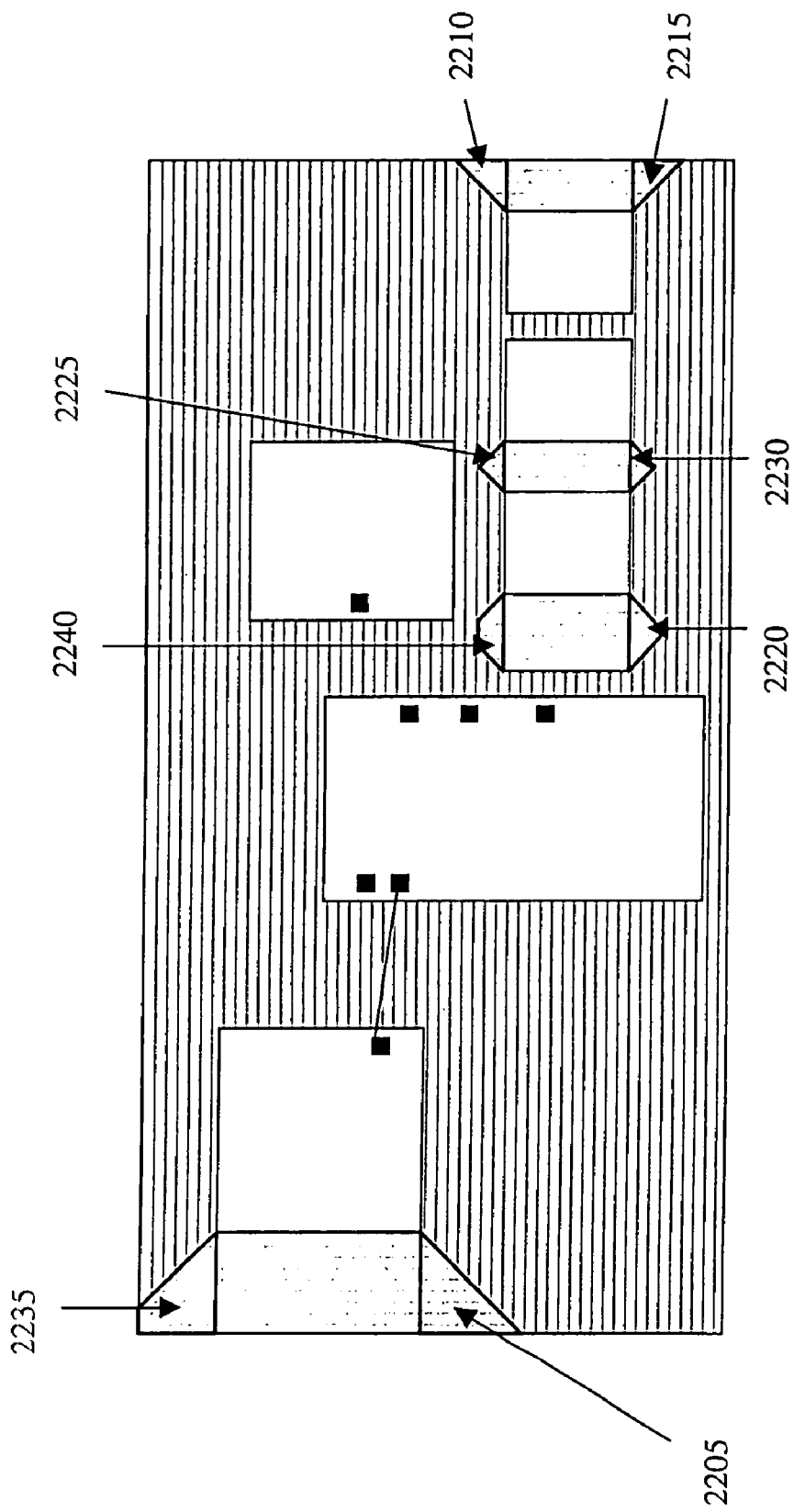
FIG. 22 illustrates an example of a boundary adjustment operation.

FIG. 22 illustrates another example of the boundary adjustment operation. This example is a continuation of the examples illustrated in FIGS. 10, 12, and 17. This figure illustrates the creation of crown extensions for each of the LPDRs with vertical LPDs. Crown extensions 2205, 2210, and 2215 are triangular extensions extended from one side of the LPDR, while crown extensions 2220, 2225, and 2230 are triangular extensions extended from both sides of the LPDR. Extensions 2235 and 2240 are four sided extensions that resulted because of the boundary of the layer or because of the minimum spacing requirement for pin access.

Some embodiments might use different rules for performing boundary adjustments on layers with diagonal global preferred directions than on layers with Manhattan global preferred directions. An LPDR, with a Manhattan LPD and a Manhattan outline on a layer with diagonal global preferred wiring, is always permeable itself. However, the LPDRs created around it can deteriorate its permeability/routability. Accordingly, for each macro on a diagonal layer that has LPDRs on two consecutive sides, some embodiments extend the two LPDRs to join them at the corner vertex where the sides meet. The modus operandi of this extension is to extend the Manhattan bound of region-end-point to a large value, and constrain the region with a diagonal bound. The bound is stretched diagonally outward from the vertex of the two consecutive sides.

Figure 23:
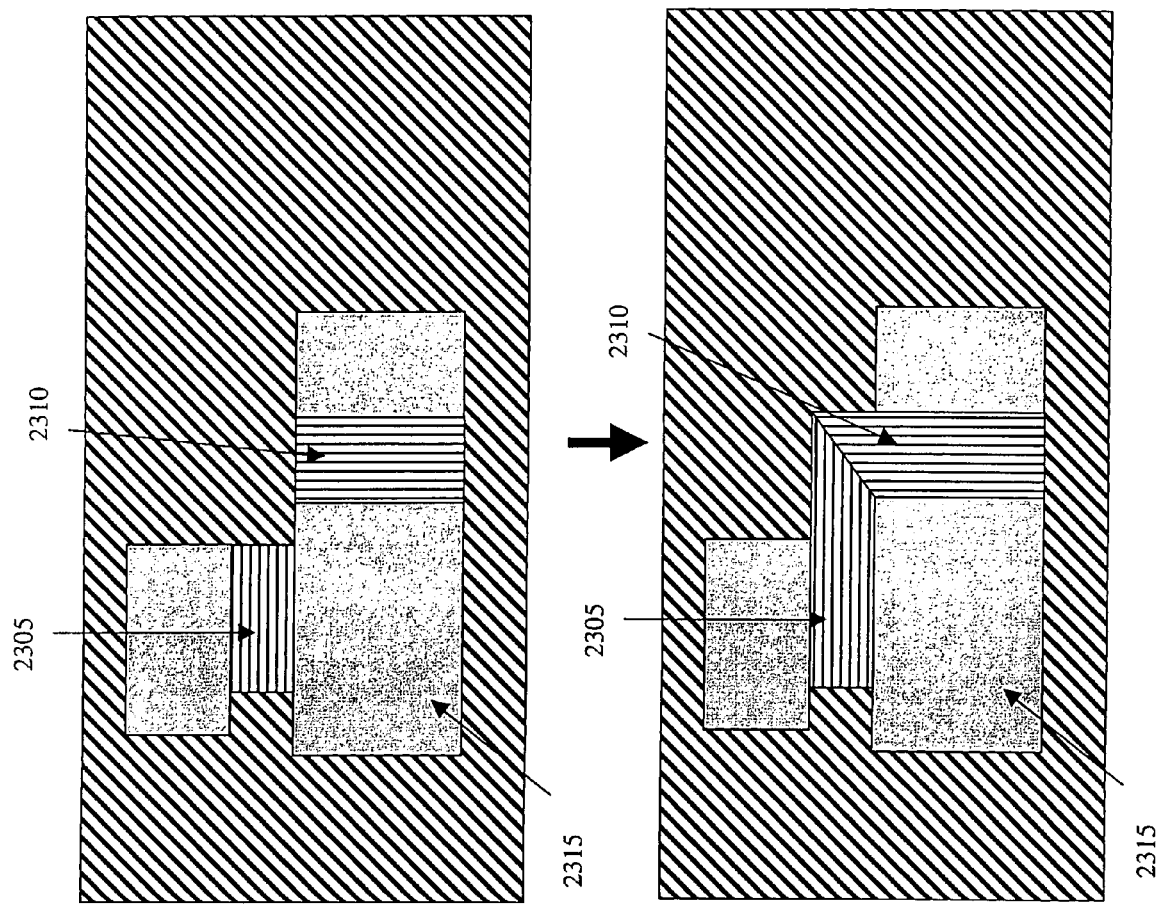
FIGS. 23-25 illustrate examples extensions of LPDRs.
Figure 24:
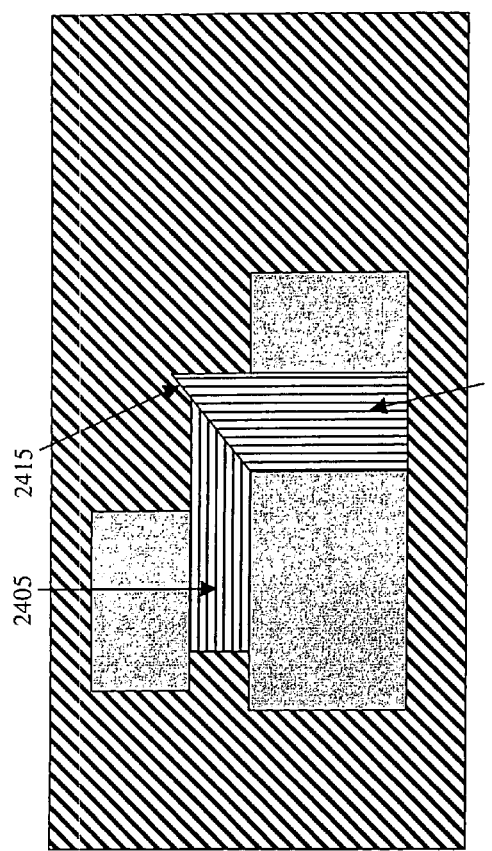
Figure 25:
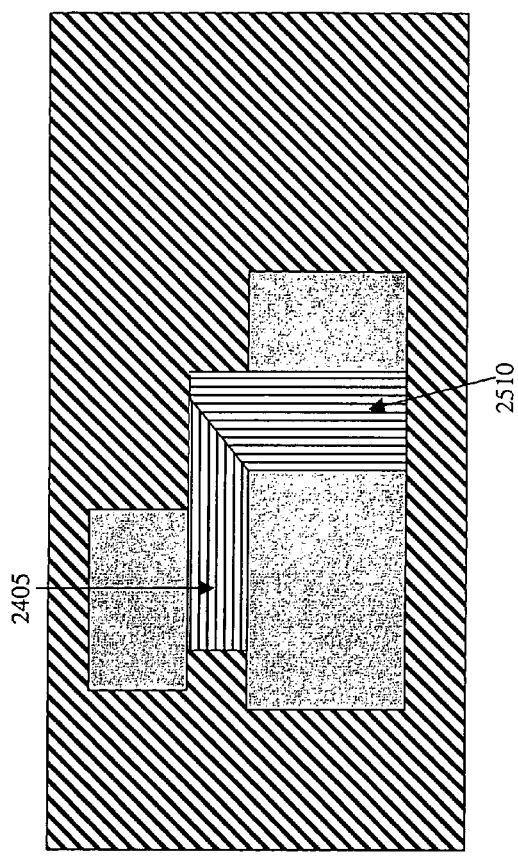

FIG. 23 illustrates an example of such an extension. Specifically, this figure illustrates expanding two LPDRs 2305 and 2310 that abut a macro 2315 to improve the routability between these LPDRs and the rest of the layer. Such a solution might lead to odd boundaries between the LPDRs, such as the contact between LPDRs 2405 and 2410 that are illustrated in FIG. 24. This contact creates an impermeable edge 2415 between the LPDR 2410 and the rest of the layer as it is parallel to the global preferred wiring direction of the layer. Such an impermeable edge is created because the height of LPDR 2405 is smaller than the width of LPDR 2410. In such cases, the two LPDRs might not be extended at all, might be extended as shown in FIG. 24 but then corrected during a manual LPDR creation by a designer, or might be extended in a manner that results in the pentagonal shape for LPDR 2510 that is illustrated in FIG. 25.

In extending LPDRs, the boundary adjustment operation at 940 might lead to the LPDRs overlapping other LPDRs. So, after the boundary adjusting operation at 940, the process 900 checks (at 945) all LPDRs on the selected layer to make sure that no two LPDRs overlap. When it identifies two LPDRs that overlap, it deletes (at 945) one of them (e.g., the smaller LPDR) in the region of the overlaps. After 945, the process determines (at 950) whether it has examined all the wiring layers. If not, the process returns to 905 to select another wiring layer and then performs the subsequent operations to potentially define one or more LPDs on this layer. When the process determines (at 950) that it has examined all the wiring layers that it needs to examine, the process ends.

B. Power Via Arrays

Power structures often reduce the routing resources that are available on the wiring layers. Power via arrays are one example of such power structures. A power via array includes a set of vias that are used to route power from power lines (also called power stripes) on the topmost metal layers down into the lower metal layers. These power stripes require Manhattan directed wiring to access the set of vias in the power array. Accordingly, as discussed above, problems in routing arise when trying to route wiring on a diagonal layer with Manhattan power stripes. As further described above, some embodiments solve this problem by defining LPDRs with Manhattan LPDs for horizontally or vertically aligned power via arrays.

Figure 26:
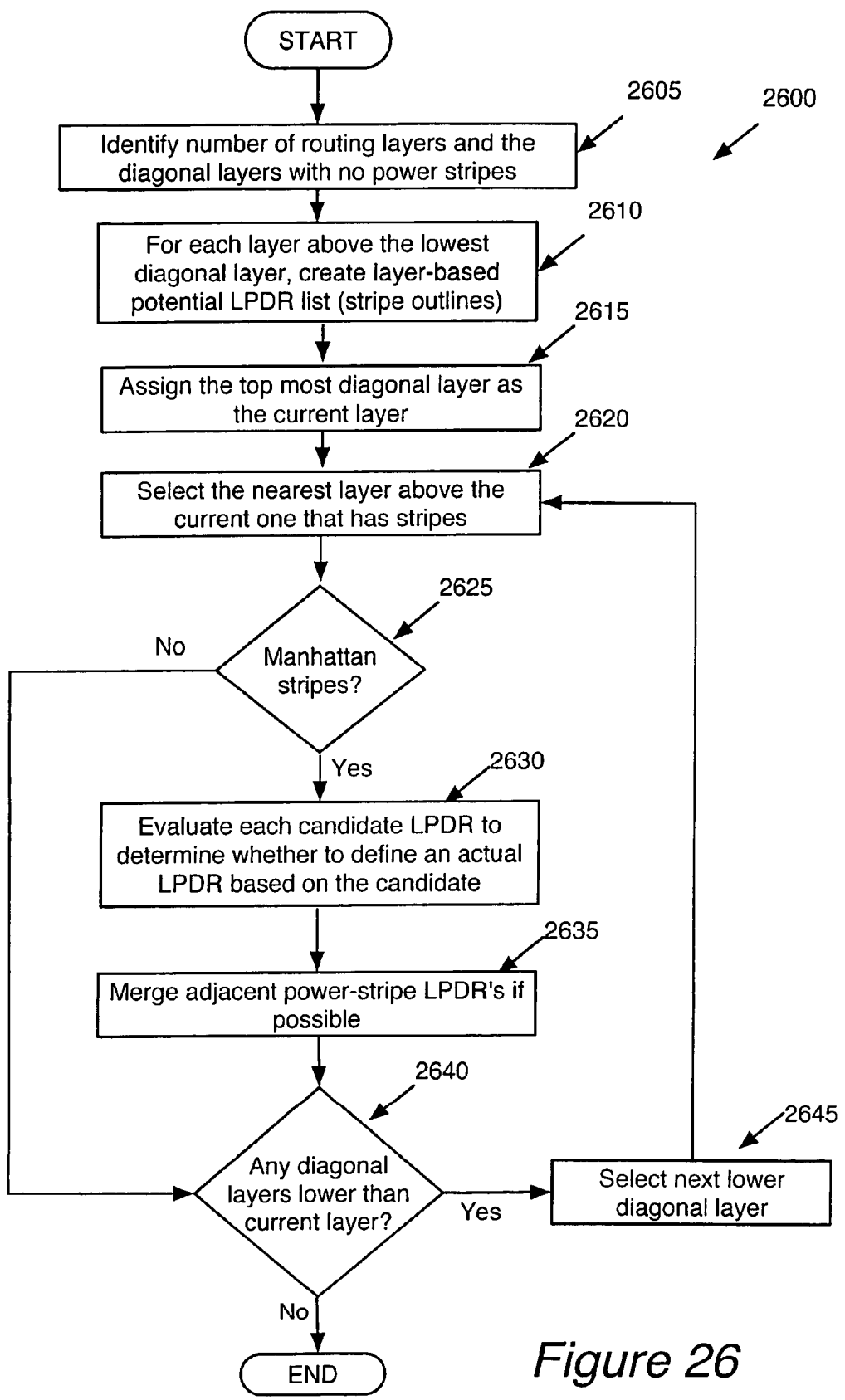
FIG. 26 illustrates a process that the LPDR generator of some embodiments uses to create LPDRs between power via arrays on diagonal wiring layers.

FIG. 26 illustrates a process 2600 that the LPDR generator of some embodiments uses to create LPDRs between power via arrays on diagonal wiring layers. This process creates LPDRs starting from the top-most diagonal layer and moves down until it finishes with all the diagonal layers. In a layer, the process considers all the power stripes in some embodiments, while considering only power stripes greater than a configurable threshold size (e.g., 100 micron) in other embodiments. The process ignores all diagonal power stripes. For each Manhattan power stripe that is greater than the threshold size, the process creates an LPDR with the same outline as the stripe. The LPD of the LPDR will be horizontal for a vertically shaped LPDR, and vertical for a horizontally shaped LPDR. For each potential LPDR, the capacity will be calculated for the Gcells containing the LPDR (with and without the LPDR). If the LPDR increases the capacity at least two-fold, the LPDR is added to the database. Otherwise, the LPDR will be discarded.

As shown in FIG. 26, the process 2600 identifies (at 2605) the number of routing layers and the diagonal layers with no power stripes. The process 2600 then iterates (at 2610) through the power and ground nets in the netclass database to identify each Manhattan power stripe that is on a layer above the lowest diagonal layer and that is larger than a particular configurable threshold size. In some embodiments, the threshold size of the Manhattan power stripe is 100 microns, although this size can be redefined by a designer. Each Manhattan power stripe identified at 2610 might be used to define an LPDR on one or more diagonal wiring layers below it, as further described below. To identify power vias, some embodiments might represent an entire power via-stack that includes multiple cuts as one via.

Next, at 2615, the process defines the Current_Layer as the topmost diagonal layer. It then selects (at 2620) the nearest layer that is above the Current_Layer and that has Manhattan power stripes. The process then determines (at 2625) whether the selected layer above the Current_Layer has a sufficient number of (e.g., ten) Manhattan power stripes. The number of power stripes that are sufficient is configurable in some embodiments.

If the process determines that the selected layer does not have a sufficient number of Manhattan power stripes, the process transitions to 2640, which will be described below. Otherwise, the process evaluates (at 2630) the outline of each particular Manhattan stripe as a potential LPDR on the Current_Layer.

Specifically, for each potential LPDR that can be defined based on each particular Manhattan stripe, the process performs (at 2630) two capacity computations for the set of Gcells that contain the potential LPDR. One capacity computation is the total capacity of all the Gcells in the set without the potential LPDR, while the other one is the total capacity of these Gcells with the potential LPDR. The capacity calculation is performed with power/ground vias taken as obstructions. When the potential LPDR fails to increase the capacity of the set of Gcells at least two-fold, the process does not define an LPDR. Alternatively, on the Current_Layer, the process defines (at 2630) an LPDR based on the outline of the particular Manhattan power stripe when the potential LPDR increases the capacity of the set of Gcells at least two-fold.

Figure 27:
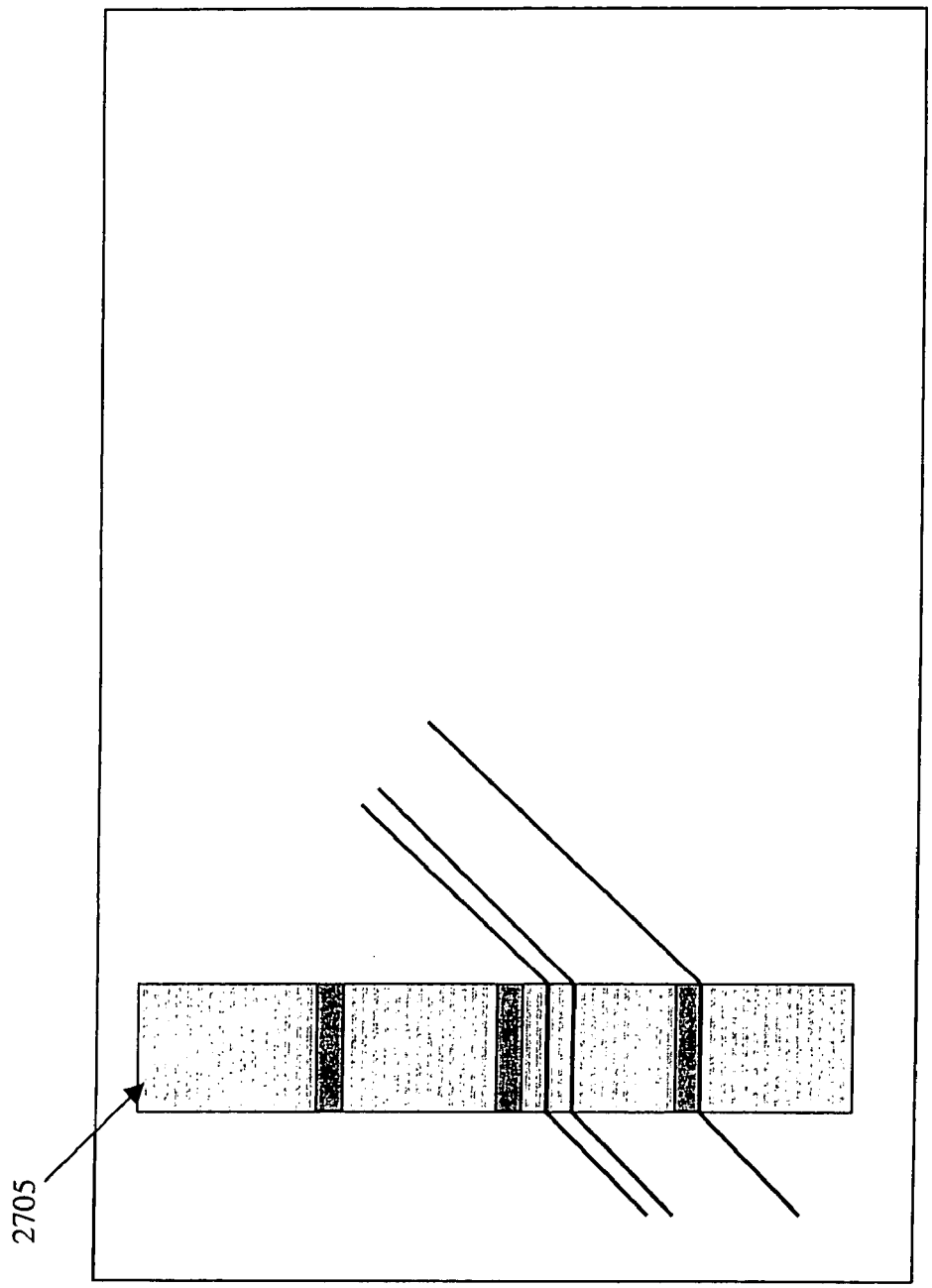
FIG. 27 illustrates an example of creating LPDRs about power structures.

FIG. 27 illustrates an example of creating LPDRs about power structures. Specifically, this figure illustrates a wiring layer that has a diagonal global preferred direction. This layer also has a region 2705 that is underneath a vertical power stripe. Hence, as shown in FIG. 27, the region 2705 can be defined as an LPDR that has a horizontal LPD. This LPD, in turn, provides horizontal routing and/or tracks that allows diagonal routing and/or tracks to pass through this region while avoiding the power-via obstacles that are defined for the vertical power stripe.

Figure 28:
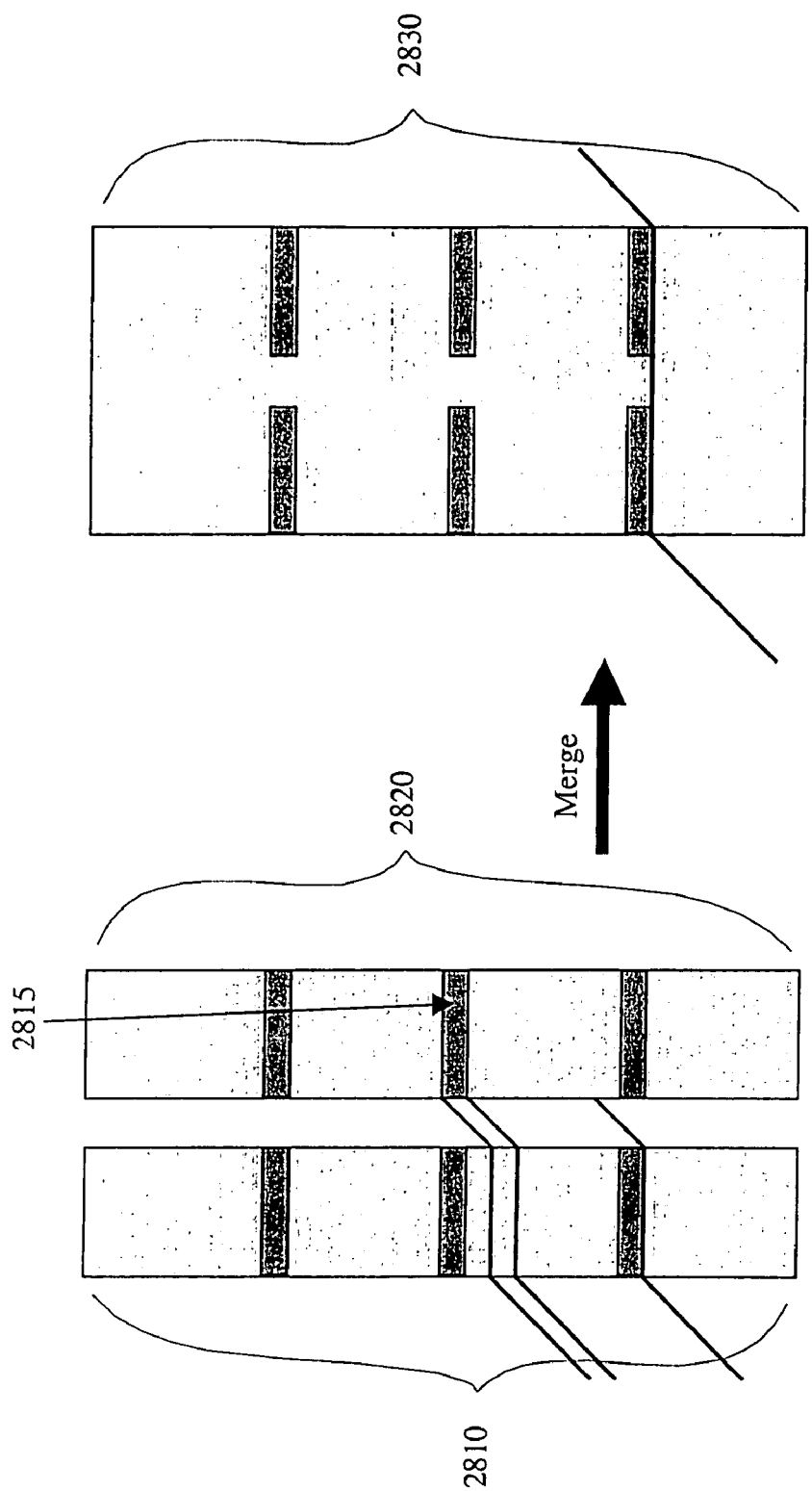
FIG. 28 illustrates the merging of the two LPDRs and to define a new LPDR.

After 2630, the process 2600 examines (at 2635) any LPDRs that it just created at 2630 to determine whether to merge adjacent LPDRs. Defining LPDRs for adjacent power stripes might create unusable channels between the LPDRs. FIG. 28 illustrates two LPDRs 2810 and 2820 that are defined for two different power stripes. In this example, the LPD in each LPDR is horizontal and the global preferred wiring direction of the layer is 45° diagonal. As shown in this figure, the wiring that leaves the LPDR 2810 that is defined for one power stripe can run into a power via stack 2815 in the LPDR 2820 of the other power strip.

FIG. 28 illustrates the merging of the two LPDRs 2810 and 2820 to define a new LPDR 2830. The "merged" LPD region 2830 is defined to encompass the region of both power stripes and has the same local preferred direction as the LPD of the replaced LPDRs 2810 and 2820. This merging allows the wiring to traverse efficiently across the region underneath the power stripes without the obstruction that existed when the two LPDRs 2810 and 2820 were separate.

Some embodiment merge power-stripe LPDRs that are closer than 10% of the stripe-width. Some embodiments perform the merging after the capacity-increase-based LPDR filtering because they assume that a region that does not gain capacity from a change to its routing direction, will not gain capacity even if merged with another LPDR. Other embodiments, however, might account for the merging while performing the capacity estimation and determining whether to define an LPDR.

In some embodiments, the merging operation merges two aligned (e.g., horizontally aligned) LPDRs by extending one LPDR (e.g., the LPDR to the left) towards the other LPDR (e.g., the LPDR to the right). The formula below quantifies the horizontal extension (HExt) of leftside LPDR towards a rightside LPDR:

HExt=(HSeparationOfStripe−viaStackOffset)mod interval, where HSeperationOfStripe is the horizontal separation of the power stripes, viaStackOffset is the amount of offset between the via stack in the left stripe and the via stack of the right stripe, and interval is the distance between the two via stacks that are part of the stripe corresponding to the left LPDR. Some embodiments put a ceiling on the extension to make sure that not more than a particular percent of the layer is converted to LPDRs. For example, a Horizontal extension will take place only if the value is less than the stripe's width. A value greater than the ceiling is ignored, as it would not be helpful to draw anything less than the horizontal value. Hence, in such cases, some embodiments do not define the LPDR that would need to surpass the ceiling.

A second step after the extensions would be to check whether an LPDR has extended into the next LPDR. If so, the merging operation merges the definition of the two LPDRs, provided that they pass a capacity constraint, which will be described below. The above-described approach assumes that the via-stacks within a stripe are placed at regular intervals, that the interval remains the same for the two stripes being considered, and that power-vias do not lie outside the stripes. Some embodiments incorporate a check for such requirements at the beginning of the merging operation.

As mentioned above, the merging operation at 2635 performs another capacity-increase-based filtering. Unaligned vias can cause the failure of capacity increase. In case of a failure, the process in some embodiments discards the merged LPDR. Instead of performing a post-processing operation to merge LPDRs for adjacent power stripes, some embodiments might generate larger LPDRs at 2630 that account for the need to have a combined LPDR for adjacent power stripes.

After 2635, the process determines (at 2640) whether there is any diagonal layer lower than the Current_Layer. If so, the process selects (at 2645) the next lower layer, designates this layer as the Current_Layer, and transitions back to 2620, which was described above. Otherwise, the process ends.

Some embodiments define LPDRs about power structures in view of certain constraints. For instance, some embodiments do not create LPDRs around overlapping power stripes. In some cases, a designer has to manually analyze the LPDRs to ensure that this constraint is met. Also, as mentioned above, the LPDR generator in some embodiments first defines LPDRs about power structures and then defines LPDRs between the macros. Accordingly, the LPDR generator in some embodiments does not check whether the power-based LPDRs overlap any other existing LPDRs. In fact, the LPDR generator might delete all pre-existing LPDRs before creating any power-based LPDRs on a layer.

Figure 29:
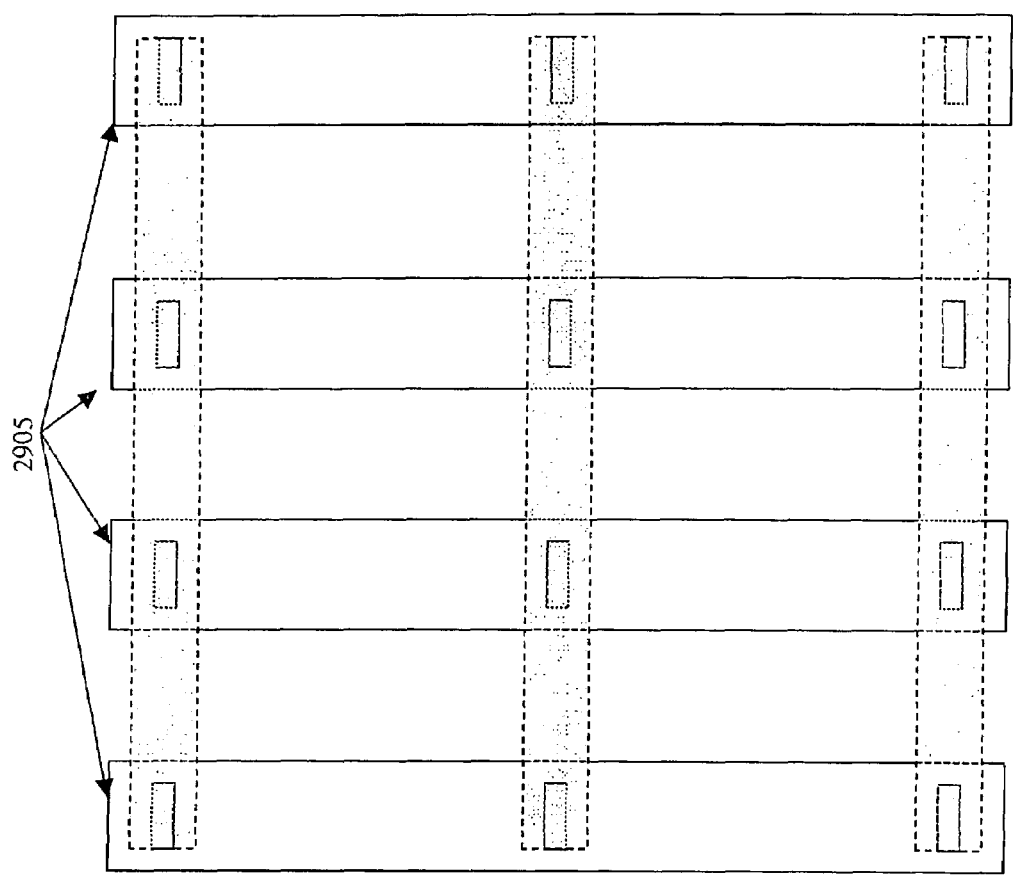
FIG. 29 illustrates an example of an alternative embodiment of the invention.

FIG. 29 illustrates an example of an alternative embodiment of the invention. This figure illustrates the outlines 2905 of several power stripes on a layer. It also illustrates several LPDRs that are orthogonal to the outline of the power stripes, instead of being defined parallel and in between the stripes.

U.S. patent application Ser. No. 11/005,316, entitled "Local Preferred Direction Architecture, Tools, and Apparatus," filed concurrently with the present application, describes the GUI of the LPDR generator of some embodiments of the invention. Also, U.S. patent application Ser. No. 11/005,448, entitled "Local Preferred Direction Routing," filed concurrently with the present application, describes the routing tools that can route a layout with LPD's. These applications are incorporated herein by reference. Other EDA tools can also consider layouts with LPD's. For instance, some embodiments might include a placer that computes placement costs (e.g., wirelength and/or congestion costs) based on the different LPD's within which the circuit modules or the pins of these modules fall.

III. Computer System

Figure 30:
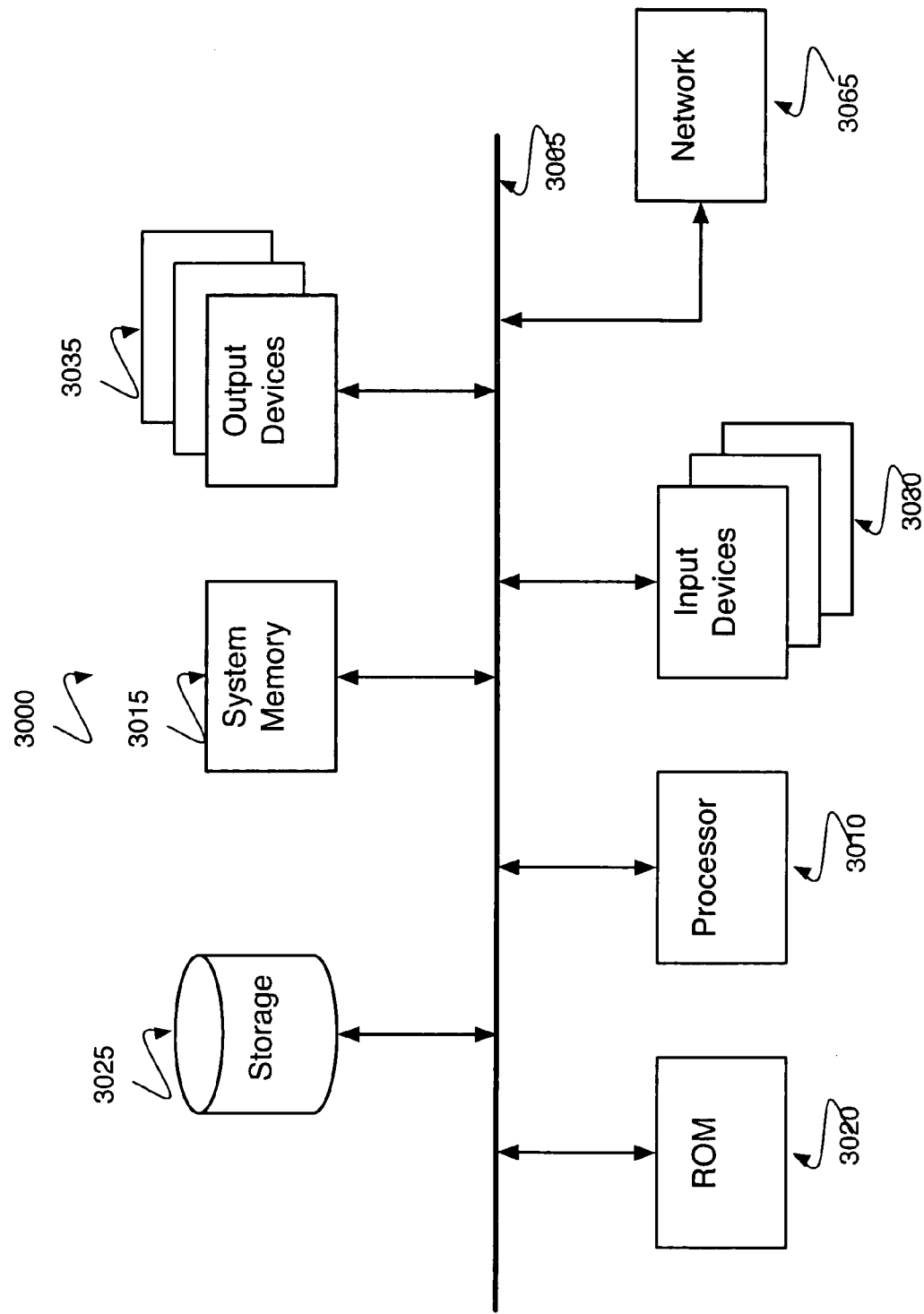
FIG. 30 conceptually illustrates a computer system with which some embodiment of the invention are implemented.

FIG. 30 conceptually illustrates a computer system with which some embodiment of the invention are implemented. Computer system 3000 includes a bus 3005, a processor 3010, a system memory 3015, a read-only memory 3020, a permanent storage device 3025, input devices 3030, and output devices 3035.

The bus 3005 collectively represents all system, peripheral, and chipset buses that support communication among internal devices of the computer system 3000. For instance, the bus 3005 communicatively connects the processor 3010 with the read-only memory 3020, the system memory 3015, and the permanent storage device 3025.

From these various memory units, the processor 3010 retrieves instructions to execute and data to process in order to execute the processes of the invention. The read-only-memory (ROM) 3020 stores static data and instructions that are needed by the processor 3010 and other modules of the computer system. The permanent storage device 3025, on the other hand, is a read-and-write memory device. This device is a non-volatile memory unit that stores instruction and data even when the computer system 3000 is off. Some embodiments of the invention use a mass-storage device (such as a magnetic or optical disk and its corresponding disk drive) as the permanent storage device 3025. Other embodiments use a removable storage device (such as a floppy disk or zip® disk, and its corresponding disk drive) as the permanent storage device.

Like the permanent storage device 3025, the system memory 3015 is a read-and-write memory device. However, unlike storage device 3025, the system memory is a volatile read-and-write memory, such as a random access memory. The system memory stores some of the instructions and data that the processor needs at runtime. In some embodiments, the invention's processes are stored in the system memory 3015, the permanent storage device 3025, and/or the read-only memory 3020.

The bus 3005 also connects to the input and output devices 3030 and 3035. The input devices enable the user to communicate information and select commands to the computer system. The input devices 3030 include alphanumeric keyboards and cursor-controllers. The output devices 3035 display images generated by the computer system. For instance, these devices display IC design layouts. The output devices include printers and display devices, such as cathode ray tubes (CRT) or liquid crystal displays (LCD).

Finally, as shown in FIG. 30, bus 3005 also couples computer 3000 to a network 3065 through a network adapter (not shown). In this manner, the computer can be a part of a network of computers (such as a local area network ("LAN"), a wide area network ("WAN"), or an Intranet) or a network of networks (such as the Internet). Any or all of the components of Computer system 3000 may be used in conjunction with the invention. However, one of ordinary skill in the art will appreciate that any other system configuration may also be used in conjunction with the invention.

While the invention has been described with reference to numerous specific details, one or ordinary skill in the art will recognize that the invention can be embodied in other specific forms without departing from the spirit on the invention. For instance, some embodiments define a crown boundary between the LPDR with a Manhattan LPD (e.g., a horizontal direction) and an LPDR with a non-Manhattan LPD (e.g., a 45° diagonal direction) in terms of an angle that is between the Manhattan and non-Manhattan directions (e.g., a 22.5° direction). Thus, one of ordinary skill in the art would understand that the invention is not to be limited by the foregoing illustrative details, but rather is to be defined by the appended claims.

We claim:

1. A computer-implemented method of defining wiring directions in a design layout of an integrated circuit ("IC"), said design layout comprising a plurality of wiring layers, the computer-implemented method comprising:
   automatically decomposing a wiring layer into a plurality of non-overlapping regions;
   assigning at least two different local preferred wiring directions to at least two of the regions;
   identifying a boundary between two regions that has a wireflow capacity that is smaller than a particular threshold;
   modifying the shape of the two regions at the boundary to improve wireflow capacity across the boundary between the two regions; and
   displaying the design layout with said two regions in a display area of a computer, said displaying of the design layout providing an indication of the local preferred wiring direction of at least one region.

2. The method of claim 1, wherein the design layout comprises a set of items comprising a set of vertices, wherein decomposing the wiring layer comprises using the vertices of items in the layout to decompose the layout.

3. The method of claim 2, wherein the items include macro blocks.

4. The method of claim 2, wherein using the vertices comprises projecting rays from the set of vertices.

5. The method of claim 1 further comprising:
   a) identifying a plurality of power via arrays on the wiring layer; and
   b) identifying a local preferred wiring direction based on the arrangement of the power via arrays on the wiring layer.

6. The method of claim 5 further comprising:
   a) identifying an alignment direction that the power via arrays are aligned on the wiring layer; and
   b) defining the local preferred wiring direction to be perpendicular to the identified alignment direction of the power via arrays.

7. The method of claim 5 further comprising:
   a) identifying sets of aligned power via arrays that are parallel to each other and are within a certain threshold distance of each other; and
   b) treating the parallel sets of aligned via arrays as one set of aligned via arrays in order to define local preferred direction between the arrays that stays constant across the parallel via arrays.

8. The method of claim 1, wherein the boundary has zero wireflow capacity when the boundary is parallel to the local preferred direction of one of the two regions; wherein modifying the shape comprises changing the alignment of the boundary so that the boundary is no longer parallel to the local preferred direction of either of the two regions.

9. The method of claim 1 further comprising using the different local preferred wiring directions to identify routes in the design layout.

10. The method of claim 1 further comprising using the different local preferred wiring directions during a placement operation that identifies a position for a plurality of circuit modules in the design layout.

11. The method of claim 1 further comprising, before displaying the design layout, defining the design layout for the IC based on the regions comprising the assigned local preferred wiring directions.

12. The method of claim 1 further comprising, before displaying the design layout, routing a set of nets in at least one of the regions based on the assigned local preferred wiring directions of the regions.

13. A computer readable medium storing a computer program for defining wiring directions in a design layout of an integrated circuit ("IC"), said design layout comprising a plurality of wiring layers, the computer program comprising sets of instructions for:
   automatically decomposing a wiring layer into a plurality of non-overlapping regions;
   assigning at least two different local preferred wiring directions to at least two of the regions;
   identifying a boundary between two regions that has a wireflow capacity that is smaller than a particular threshold;
   modifying the shape of the two regions at the boundary to improve wireflow capacity across the boundary between the two regions; and
   displaying the design layout with said two regions in a display area of a computer, said displaying of the design layout providing an indication of the local preferred wiring direction of at least one region.

14. The computer readable medium of claim 13, wherein the design layout comprises a set of items comprising a set of vertices, wherein the instructions for decomposing the wiring layer comprises a set instructions for using the vertices of items in the layout to decompose the layout.

15. The computer readable medium of claim 14, wherein the items include macro blocks.

16. The computer readable medium of claim 14, wherein the set instructions for using the vertices comprises a set instructions for projecting rays from the set of vertices.

17. The computer readable medium of claim 13, wherein the computer program further comprises sets of instructions for:
    a) identifying a plurality of power via arrays on the wiring layer; and
    b) identifying a local preferred wiring direction based on the arrangement of the power via arrays on the wiring layer.

18. The computer readable medium of claim 17, wherein the computer program further comprises sets of instructions for:
    a) identifying an alignment direction that the power via arrays are aligned on the wiring layer; and
    b) defining the local preferred wiring direction to be perpendicular to the identified alignment direction of the power via arrays.

19. The computer readable medium of claim 17, wherein the computer program further comprises sets of instructions for:
    a) identifying sets of aligned power via arrays that are parallel to each other and are within a certain threshold distance of each other; and
    b) treating the parallel sets of aligned via arrays as one set of aligned via arrays in order to define local preferred direction between the arrays that stays constant across the parallel via arrays.

20. The computer readable medium of claim 13, wherein the boundary has zero wireflow capacity when the boundary is parallel to the local preferred direction of one of the two regions; wherein the set of instructions for modifying the shape comprises a set of instructions for changing the alignment of the boundary so that the boundary is no longer parallel to the local preferred direction of either of the two regions.

21. The computer readable medium of claim 13, wherein the set of instructions for assigning at least two different local preferred wiring directions to at least two of the regions comprises a set of instructions for selecting a particular region that satisfies a particular criterion, wherein the particular criterion is a set of geometric criteria that specifies minimum and maximum dimensions of a region that can be selected.

22. The computer readable medium of claim 13, wherein the computer program further comprises a set of instructions for, before displaying the design layout, defining the design layout for the IC based on the regions comprising the assigned local preferred wiring directions.

23. The computer readable medium of claim 13, wherein the computer program further comprises a set of instructions for, before displaying the design layout, routing a set of nets in at least one of the regions based on the assigned local preferred wiring directions of the regions.

24. A computer-implemented method of defining wiring directions in a design layout of an integrated circuit ("IC"), said design layout comprising a plurality of wiring layers, the computer-implemented method comprising:
    automatically decomposing a wiring layer into a plurality of non-overlapping regions;
    assigning at least two different local preferred wiring directions to at least two of the regions, wherein assigning at least two different local preferred wiring directions to at least two of the regions comprises selecting a particular region that satisfies a particular criterion, wherein the particular criterion is a set of geometric criteria that specifies minimum and maximum dimensions of a region that can be selected, wherein the selected particular region is assigned a diagonal local preferred wiring direction when the selected region is between two items that are offset to each other on the wiring layer; and
    displaying the design layout with said two regions in a display area of a computer, said displaying of the design layout providing an indication of the local preferred wiring direction of at least one region.

25. A computer-implemented method of defining wiring directions on a wiring layer of a design layout for an integrated circuit ("IC"), the computer-implemented method comprising:
    automatically detecting a plurality of candidate regions on the wiring layer;
    from the plurality of candidate regions, designating a set of local preferred direction (LPD) regions, wherein the set of LPD regions comprises a first region that comprises a first local preferred wiring direction that is different than a second local preferred wiring direction associated with a second region on the wiring layer, wherein the first and second regions share a boundary;
    determining whether the boundary is an impermeable boundary;
    modifying a shape of the boundary when the boundary is impermeable; and
    displaying the design layout with said LPD regions in a display area of a computer, said displaying of the design layout providing an indication of the local preferred wiring direction of at least one LPD region.

26. The method of claim 25, wherein the boundary is impermeable when the boundary of the first region is parallel to the second local preferred wiring direction of the second region.

27. The method of claim 25, wherein said modifying comprises specifying a triangular shape for the boundary.

28. The method of claim 25, wherein said modifying comprises specifying a crown shape for the boundary, wherein the crown shape provides bending points for a set of routes that traverses the first and second regions.

29. The method of claim 25, wherein said modifying comprises extending the shape of the first region.

30. A computer-implemented method of defining wiring directions in a design layout of an integrated circuit ("IC"), said design layout comprising a plurality of wiring layers, the computer-implemented method comprising:
    identifying a power structure for the design layout, wherein the power structure comprises at least one power stripe aligned in a particular direction;
    based on the power structure, specifying first and second non-overlapping regions on a wiring layer, wherein the first region comprises a first local preferred wiring direction and the second region comprises a second local preferred wiring direction that is different than the first local preferred wiring direction, wherein the first local preferred wiring direction is perpendicular to the particular direction of said at least one power stripe; and
    displaying the design layout with said two regions in a display area of a computer, said displaying of the design layout providing an indication of the local preferred wiring direction of at least one region.

31. The method of claim 30, wherein identifying the power structure comprises identifying a power via arrangement.

32. A computer-implemented method of defining wiring directions in a design layout of an integrated circuit ("IC"), said design layout comprising a plurality of wiring layers, the computer-implemented method comprising:

identifying a power structure for the design layout;

based on the power structure, specifying first and second non-overlapping regions on a wiring layer, wherein the first region comprises a first local preferred wiring direction and the second region comprises a second local preferred wiring direction that is different than the first local preferred wiring direction, wherein specifying the first region comprises merging two regions that are closer to each other than a particular threshold, wherein merging comprises merging two regions that are defined based on two different power stripes; and displaying the design layout with said merged regions in a display area of a computer, said displaying of the design layout providing an indication of the local preferred wiring direction of at least one region.

* * * * *